(12) United States Patent
LaRoche et al.

(10) Patent No.: US 11,476,154 B2
(45) Date of Patent: Oct. 18, 2022

(54) FIELD EFFECT TRANSISTOR HAVING IMPROVED GATE STRUCTURES

(71) Applicant: Raytheon Company, Waltham, MA (US)

(72) Inventors: Jeffrey R. LaRoche, Austin, TX (US); John P. Bettencourt, Boxford, MA (US); Paul J. Duval, Lexington, MA (US); Kelly P. Ip, Lowell, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/583,984

(22) Filed: Sep. 26, 2019

(65) Prior Publication Data

US 2021/0098285 A1     Apr. 1, 2021

(51) Int. Cl.
   *H01L 21/768*     (2006.01)
   *H01L 23/532*     (2006.01)

(52) U.S. Cl.
   CPC .... *H01L 21/76811* (2013.01); *H01L 21/7682* (2013.01); *H01L 21/76831* (2013.01); *H01L 23/53295* (2013.01)

(58) Field of Classification Search
   None
   See application file for complete search history.

(56) References Cited

U.S. PATENT DOCUMENTS

| | | | |
|---|---|---|---|
| 5,652,157 A | 7/1997 | Hirano et al. | |
| 5,869,364 A | 2/1999 | Nakano et al. | |
| 6,255,202 B1 | 7/2001 | Lyons et al. | |
| 8,558,281 B1 | 10/2013 | Regan et al. | |
| 9,887,089 B2 | 2/2018 | Hwang et al. | |
| 10,096,550 B2 | 10/2018 | LaRoche et al. | |
| 2005/0205927 A1 | 9/2005 | Tsujii | |
| 2010/0244018 A1* | 9/2010 | Kaneko | H01L 29/7786 257/E21.403 |
| 2013/0105893 A1 | 5/2013 | Petit et al. | |
| 2013/0119400 A1 | 5/2013 | Shinohara et al. | |
| 2013/0248873 A1* | 9/2013 | Kuraguchi | H01L 29/475 257/192 |
| 2013/0271208 A1 | 10/2013 | Then et al. | |
| 2014/0284661 A1* | 9/2014 | Williams | H01L 29/812 257/192 |
| 2016/0086794 A9 | 3/2016 | Cheng et al. | |

(Continued)

FOREIGN PATENT DOCUMENTS

EP     2 770 535 A2     8/2014
WO    WO 2013/095345 A1  6/2013

OTHER PUBLICATIONS

Notification of Transmittal of the International Search Report and the Written Opinion of the ISA dated Dec. 16, 2020 for International Application No. PCT/US2020/040210; 1 Page.

(Continued)

*Primary Examiner* — Daniel Whalen
(74) *Attorney, Agent, or Firm* — Daly, Crowley, Mofford & Durkee, LLP

(57) ABSTRACT

A field effect transistor, comprising a gate contact and gate metal forming a vertical structure, such vertical structure having sides and a top surrounded by an air gap formed between a source electrode and a drain electrode of the field effect transistor.

13 Claims, 35 Drawing Sheets

(56) References Cited

U.S. PATENT DOCUMENTS

2016/0099335 A1* 4/2016 Ozaki .............. H01L 21/76825
363/37

OTHER PUBLICATIONS

International Search Report dated Dec. 16, 2020 for International Application No. PCT/US2020/040210; 7 Pages.
Written Opinion of the ISA dated Dec. 16, 2020 for International Application No. PCT/US2020/040210; 12 Pages.
Taiwan Office Action (with English Translation) dated Apr. 30, 2021 for Application No. 109123043; 8 Pages.
Brown, et al.; "Self-Aligned AlGaN/GaN FinFETs"; IEEE Electron Device Letters; vol. 38; No. 10; pp. 1445-1448; Oct. 2017; 4 Pages.
Chan, et al.; "High electron mobility recovery in AlGaN/GaN 2DEG channels regrown on etched surfaces"; Semiconductor Science and Technology 31; Apr. 14, 2016; 8 Pages.
LaRoche, et al.; "Towards a Si Foundry-Compatible, High-Performance, ≤0.25 μm Gate, GaN-on-Si MMIC Process on High-Resistivity 200 mm <111> Si with A Cu Damascene BEOL"; CS ManTech Conference; pp. 35-38 Pages; May 16-19, 2016; 4 Pages.
Noguchi, et al.; "Multilevel Interconnect With Air-Gap Structure for Next-Generation Interconnections"; IEEE Transactions on Electron Devices; vol. 56; No. 11; pp. 2675-2682; Nov. 2009; 8 Pages.
Invitation to Pay Additional Fees, dated Sep. 18, 2020, PCT/US2020/040210, 11 pages.
Response (with Machine English Translation) to Taiwan Office Action dated Apr. 30, 2021 for Taiwan Application No. 109123043; Response Filed Aug. 3, 2021; 10 Pages.
Taiwan Allowance Decision (with Machine English Translation) dated Aug. 31, 2021 for Taiwan Application No. 109123043; 3 Pages.
PCT International Preliminary Report on Patentability dated Apr. 7, 2022 for International Application No. PCT/US2020/040210; 12 Pages.

* cited by examiner

FIELD EFFECT TRANSISTOR HAVING IMPROVED GATE STRUCTURES

TECHNICAL FIELD

This disclosure relates generally to Field Effect Transistors and more particularly to FETS having gate structures having low capacitance and resistance when such gate structures are in contact with, and connected, to copper Damascene based interconnects.

BACKGROUND OF THE INVENTION

As is known in the art, geometric scaling down in size of field effect transistor device dimension has a significant impact on high frequency performance. Typically when a transistor is scaled down in size, gate lengths are reduced along with source drain spacing. With this reduction in dimensions a greater emphasis is put on the placement of the gate within the source drain region with greatest potential performance enhancements achieved by placing the gate closer to the source than the drain. Also scaling of resistances can increase, in particular resistances of the gate, can adversely impact frequency response and noise figure of the transistor. Additionally dielectric loading in close proximity to gate electrode can also adversely impact transistor frequency response.

As is also known in the art, the manufacturing of GaN HEMT transistor devices and integrated circuits have been demonstrated in Silicon CMOS "like" single or dual damascene wafer processes (see "Towards a Si Foundry-Compatible, High-Performance, ≤0.25 μm Gate, GaN-on-Si MMIC Process on High-Resistivity <111> Si With A. Cu Damascene BEOL" by LaRoche et al., CS Man Tech Conference May 16th-19th, Miami, Fla.). This is possible due to compatibility of CMOS integrated processes and metallization schemes with GaN integrated circuited processes. To that end, as Gate Lengths of GaN HEMTs scale downward in size and dielectric loading is minimized when using CMOS "like" processes, as noted above, attention has to be giving to the gate size, placement, resistance and dielectric loading close to the gate.

In CMOS like processes, lithographic definition of fine line geometries of aggressively scaled FETs with conventional photolithography or electric beam (e-beam) lithography approaches can limit size, aspect ratio and placement of gates within source drain regions. Sidewall image transfer techniques, where a thin film sidewall is defined about a sacrificial core or mandrel, are often used in used in nanometer CMOS processes Additionally, with damascene interconnect in CMOS processes air-gaps about the metallization are often used to improve the frequency response of the passive interconnects, see for example "Multilevel Interconnect With Air-Gap Structure for Next-Generation Interconnections" Junji Noguchi et al., IEEE Transactions on Electron Devices Vol. 56, Issue 11, November 2009. However, the transistor itself is still dielectrically loaded by damascene oxide, degrading its frequency response.

SUMMARY OF THE INVENTION

In accordance with the present disclosure, a field effect transistor is provided having a gate contact and gate metal forming a vertical structure, such vertical structure having sides and a top surrounded by an air gap formed between a source electrode and a drain electrode of the field effect transistor.

In one embodiment, the source electrode and the drain electrode are damascene structures.

In one embodiment, the gate contact and gate metal form a vertical structure, such vertical structure having sides and a top surrounded by the air gap extending vertically to a level parallel to the top of the damascene structures.

In one embodiment, the gate contact is comprised of a plurality of stacked damascene metal layers.

In one embodiment, the gate contact is comprised of a plurality of stacked damascene metal layers extending vertically to a level parallel to a top of the damascene structures.

In one embodiment the field effect transistor is a mesa structure and wherein the gate contact and gate metal form a vertical structure, such vertical structure having sides and a top surrounded by an air gap formed between the source and drain electrodes and between the mesa edges that are perpendicular to the direction of the gate.

In one embodiment, a field effect transistor structure is provided, comprising: a III-N buffer layer; an III-N channel layer of disposed over III-N buffer layer; a barrier layer disposed on the channel layer; wherein a 2 DEG is formed in the channel layer; a uniformly thick, horizontally extending doped GaN layer disposed on the III-N buffer layer, such uniformly thick layer of doped GaN having an aperture extending vertically there through, such aperture having vertically extending sidewalls terminating at horizontally extending upper surface portions of the III-N buffer layer; a gate electrode comprising: a vertical stem portion extending into the aperture, comprising: a portion of the III-N buffer layer, a portion of the III-N channel layer, and a portion of the buffer layer, such portion of the III-N buffer layer, the portion of the III-N channel layer, and the portion of the buffer layer forming a vertical stack of the portion of the III-N buffer layer, the portion of the III-N channel layer, and the portion of the buffer layer; wherein the vertical stack extends vertically upwardly into the aperture and between the vertically extending sidewalls of the aperture; and a gate metal disposed on the stack; source and drain contacts in Ohmic contact with an upper surface portions of the utniformly thick, horizontally extending layer of doped GaN; and wherein, the gate electrode is disposed between the source and drain electrodes.

In one embodiment, a gate contact is disposed on the gate metal, and wherein the source and drain contacts have a lower portion; and wherein the gate contact and the lower portion of the source and drain contacts have upper surfaces disposed in a common plane.

In one embodiment, the source and drain electrodes are damascene structures.

In one embodiment, the gate contact and gate metal form a vertical structure, such vertical structure having sides and a top surrounded by an air gap extending vertically to a level parallel to a top of the damascene structures.

In one embodiment, the gate contact and gate metal form a vertical structure, such vertical structure having sides and a top surrounded by an air gap.

In one embodiment, the gate contact is comprised of a plurality of stacked damascene metal layers.

In one embodiment, the gate contact is comprised of a plurality of stacked damascene metal layers extending vertically to a level parallel to a top of the damascene structures.

In one embodiment, the gate contact is comprised of a plurality of stacked damascene metal layers having non-conformal oxide disposed around the metal layers creating air gaps next to the metal layers extending vertically to a level parallel to a top of the damascene structures.

In one embodiment, a method is provided for forming a field effect transistor, comprising: forming a mandrel on a surface of a semiconductor body; forming a first dielectric spacer layer having an inner sidewall on an outer sidewall of the mandrel and having a bottom on the semiconductor body; forming a gate electrode having an inner sidewall on an outer sidewall of the first dielectric spacer layer and having a bottom on the semiconductor body; forming a second dielectric layer having an inner sidewall on an outer sidewall of the gate electrode and having a bottom on the semiconductor body; wherein the first dielectric spacer layer has a different width than the second dielectric spacer layer; and, after having formed the first dielectric layer and the second dielectric layer, removing the mandrel while leaving the gate electrode with the bottom on the semiconductor;

In one embodiment, a method is provided for forming a field effect transistor having a pair of electrically interconnected gate electrodes, one of the pair of gate electrodes being disposed between a first source electrode and a drain electrode and the other of the pair of gate electrodes being disposed between the drain electrode and a second source electrode, comprising: forming a mandrel on a surface of a semiconductor body; forming a first pair of dielectric spacer layers, each one having inner sidewalls on a corresponding one of a pair of opposing outer sidewalls of the mandrel; forming the pair of gate electrodes, one of the pair of gate electrodes being formed on outer sidewalls a first one of the first pair of dielectric spacer layers and another one of the pair of gate electrodes being formed on a second one of the first dielectric spacer layers; forming a second pair of dielectric spacer layers, each one having an inner sidewall on outer sidewalls of a corresponding one of the pair of the gate electrodes; wherein the first pair of dielectric spacer layers have different widths than the second pair of dielectric spacer layers; and after having formed the first pair dielectric layers and the second pair of dielectric layers, removing the mandrel.

With such an arrangement, a self-aligned gate and regrown Ohmics utilizing the planar gate process and Cu Damascene structure provides more tightly controlled dimensions and the gate dielectric also acts as a spacer thereby improving access resistance by contacting to damascene metallization and gate aspect ratio. This approach allows us to achieve small source-drain gaps. High-yield manufacturability of this process is ensured by its completely subtractive nature versus lift-off based processing and the fact that the gate is stabilized in oxide until the air gap (which reduces parasitic capacitance to improve gain) is formed at the end of front end of line (FEoL) processing. The Cu Damascene with Self Aligned GAN HEMT, Planar, and adjacent HEMT Air Gap reduces capacitance.

BRIEF DESCRIPTION OF THE DRAWINGS

FIGS. 20F, 20J and FIG. 20W being taken along lines 20F-20F, 20J-20J and 20W-20W, in FIGS. 20G, 20I and 20X, respectively;

FIG. 20X is a simplified, diagrammatical plan view of formation of the Field Effect Transistor FIG. 20W.

Like reference symbols in the various drawings indicate like elements.

DETAILED DESCRIPTION

Figure 1:
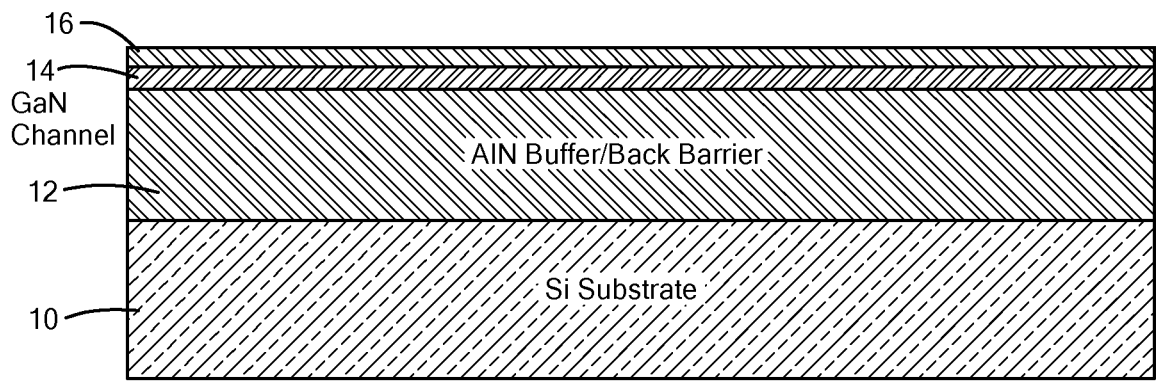
FIGS. 1-6, 7C, 8-12, 12A, 13-14, 15A-15B, 16A, 16B, 17A, 17B, 18A-18I, are simplified, diagrammatical cross-sectional sketches of steps used in the formation of a Field Effect Transistor in accordance with the disclosure.

Referring now to FIG. 1, a substrate 10, here for example silicon (Si) or silicon carbide, is shown having a Group III-V layer, here an aluminum Nitride (AlN), Gallium Nitride (GaN) or combination thereof nucleation layer or buffer/back barrier layer 12 formed epitaxially on the upper surface of the substrate 10, an undoped Group III-V layer 14, here a Gallium Nitride (GaN) layer 14 formed epitaxially on the upper surface of the layer 12 and a Group III-V layer 16, here AlGaN layer 16 formed epitaxially of the upper surface of the GaN layer 14, the GaN layer 14 providing a carrier channel, as indicated.

Figure 2:
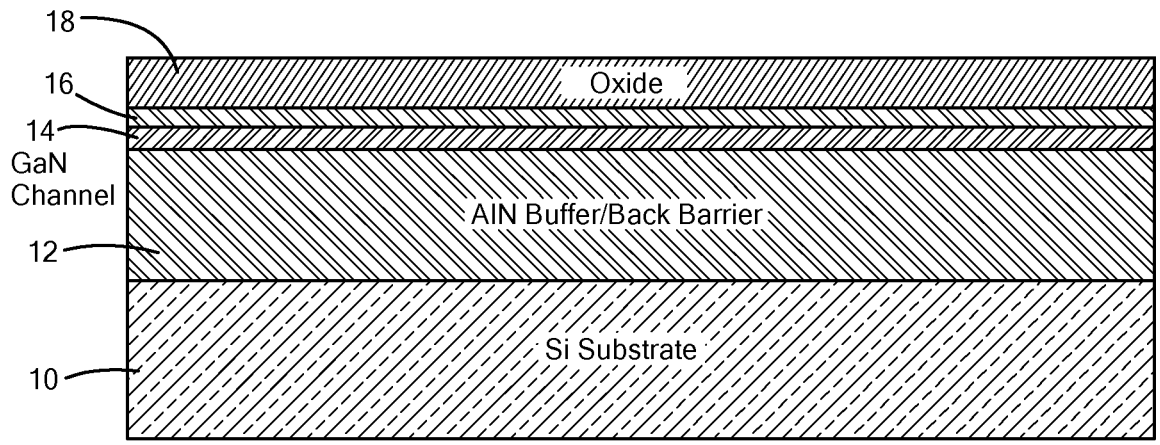

Referring to FIG. 2, a silicon oxide layer 18 is formed on the upper surface of the layer 14, as shown.

Figure 3:
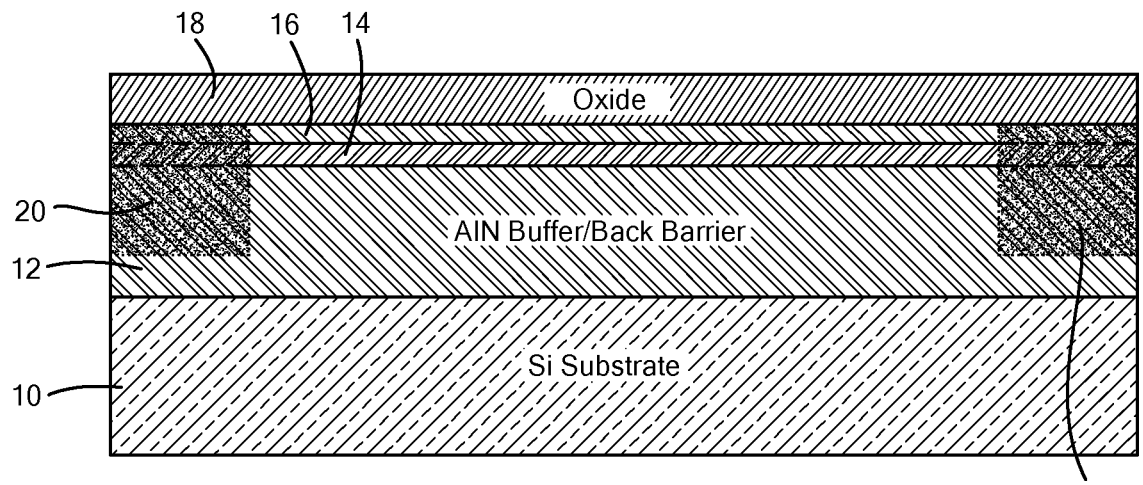

Referring now to FIG. 3, isolation regions 20 are formed through portions of the silicon dioxide layer 18, AlGaN layer 16, GaN layer 14 and into the upper portion of buffer layer 12, as shown; here, for example, such isolation regions 20 are formed by oxygen ion implantation. It should be understood that layers could be etched to form a conventional mesa isolation type structure.

Figure 4:
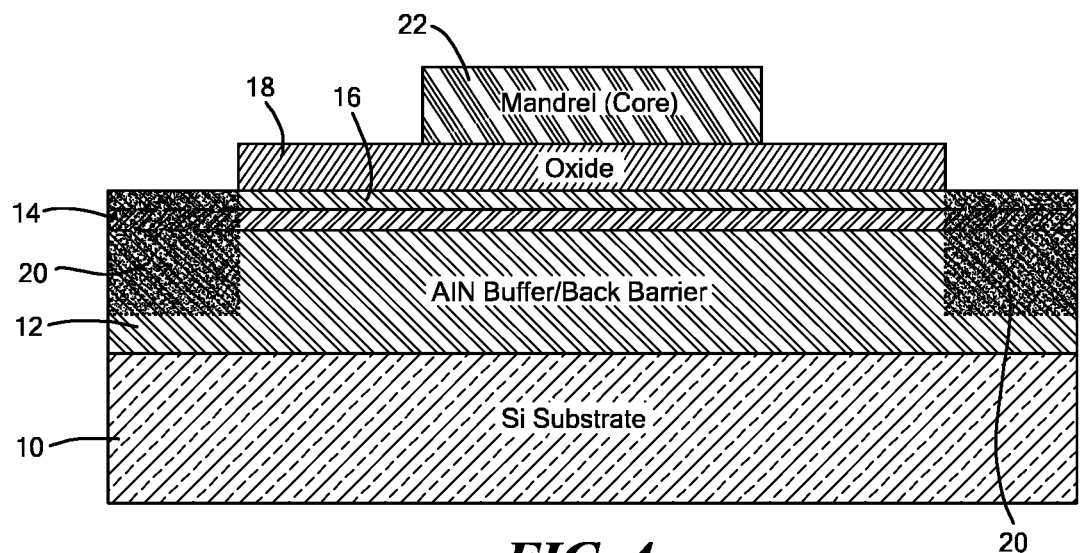
Figure 4A:
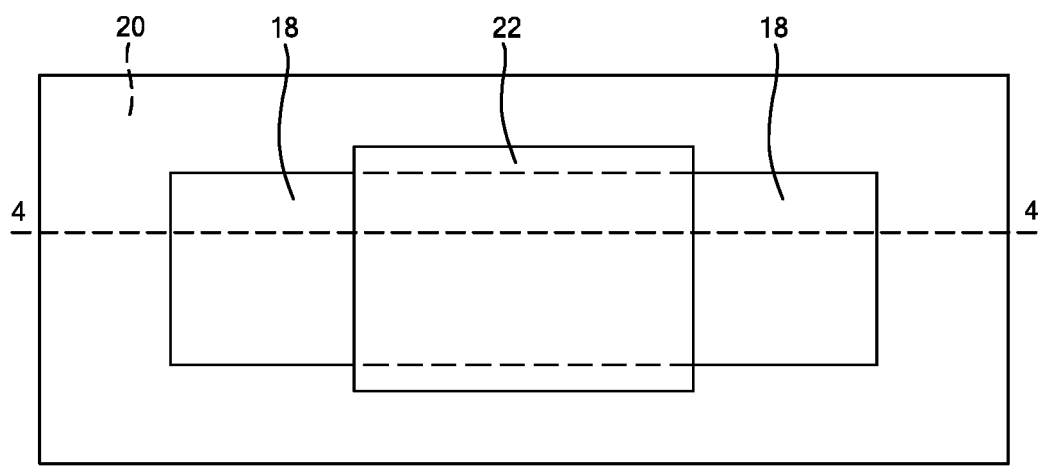
FIGS. 4A, 5A, 6A, 7A, 7B, 8A, 13A, and 14A are simplified, diagrammatical plan view sketches of steps used in the formation of the Field Effect Transistor in accordance with the disclosure, FIGS. 4, 5, 6, 7C, 8, 13, 14, being taken along lines 4-4, 5-5, 6-6, 7C-7C, 8-8, 13-13 and 14-14, in FIGS. 4A, 5A, 6A, 7B, 8A, 13A, and 14A respectively.

Referring now to FIGS. 4 and 4A, a sacrificial hard mask 22, here a four sided, rectangular-shaped, mandrel, or core, here for example polysilicon, silicon nitride, aluminum oxide, amorphous carbon or other suitable hard mask material, is formed as shown on a portion of the upper surface of the silicon oxide layer 18 in any conventional manner.

Figure 5:
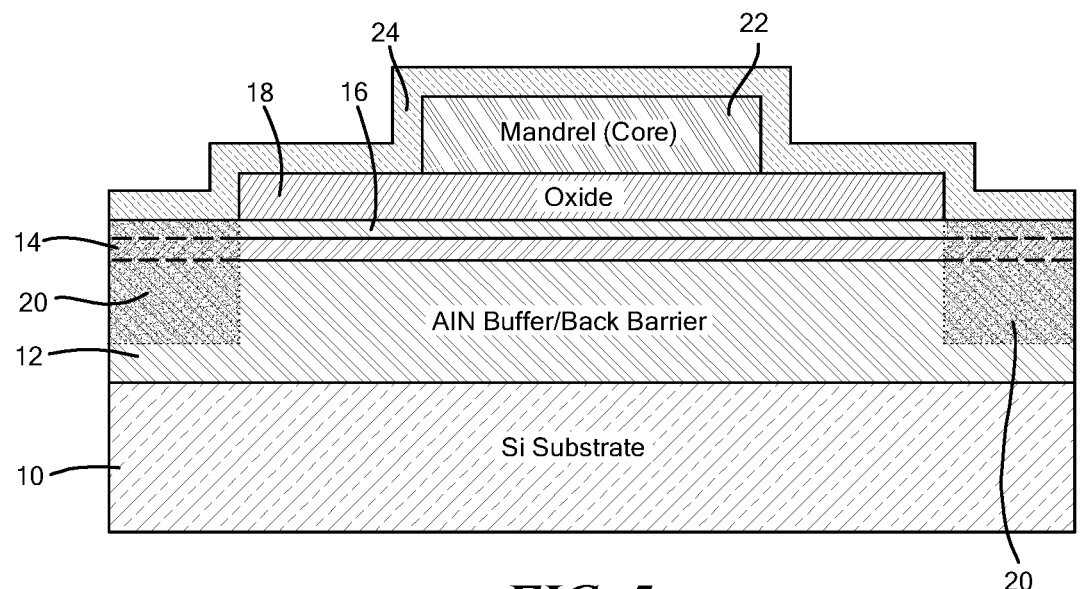
Figure 5A:
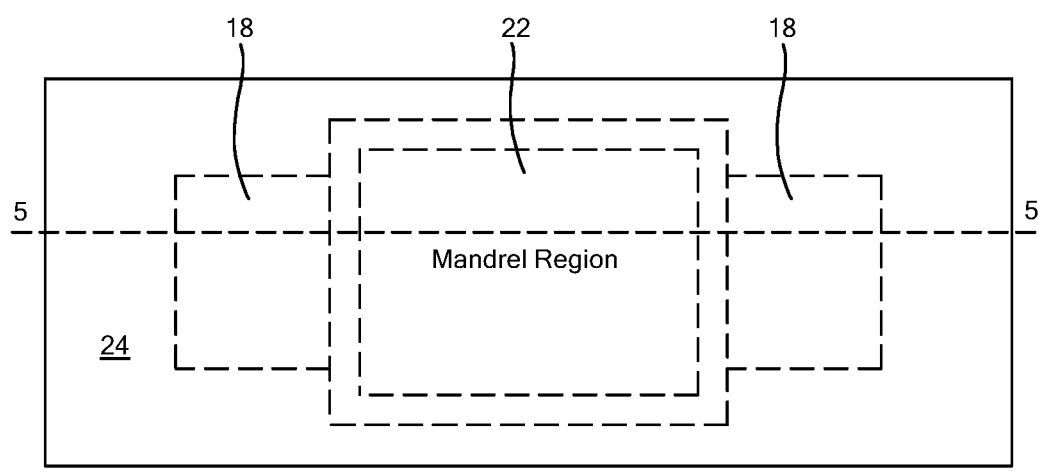

Referring now to FIGS. 5 and 5A, a conformal dielectric spacer layer 24, here Aluminum Oxide (Al2O3) polysilicon, silicon nitride, silicon oxide, amorphous carbon or other suitable material is deposited over the entire upper surface of the structure shown in FIG. 4, here by, for example, Chemical Vapor Deposition (CVD), sputter or Atomic Layer Deposition (ALD).

Figure 6:
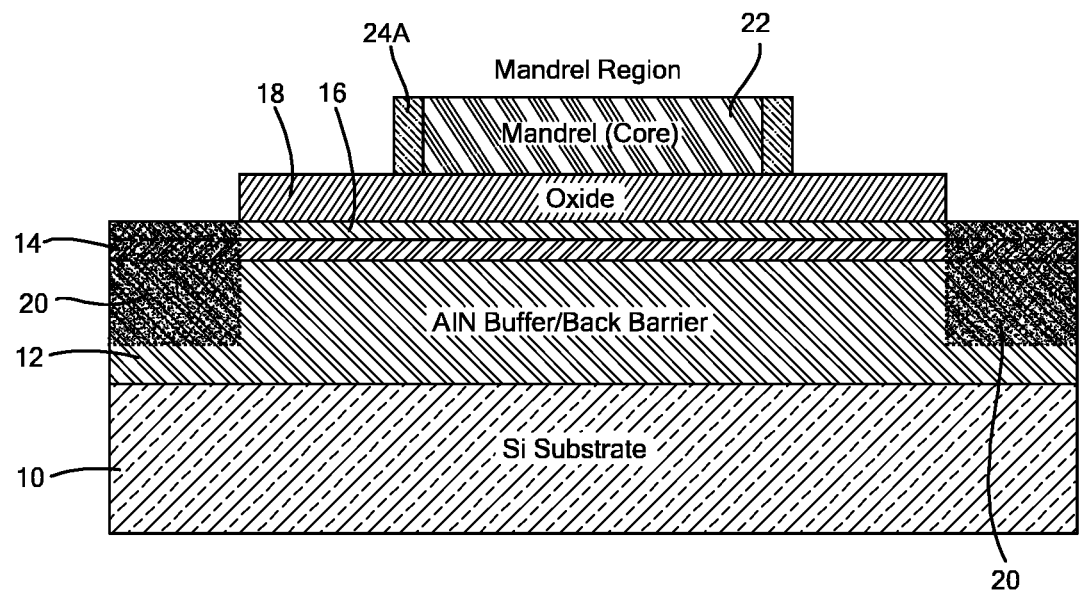
Figure 6A:
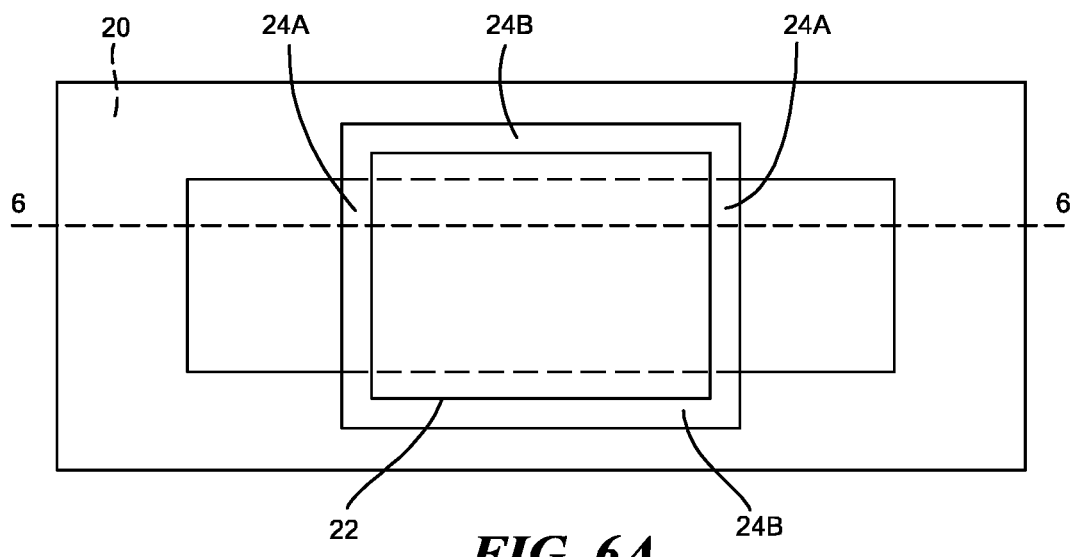
Figure 7A:
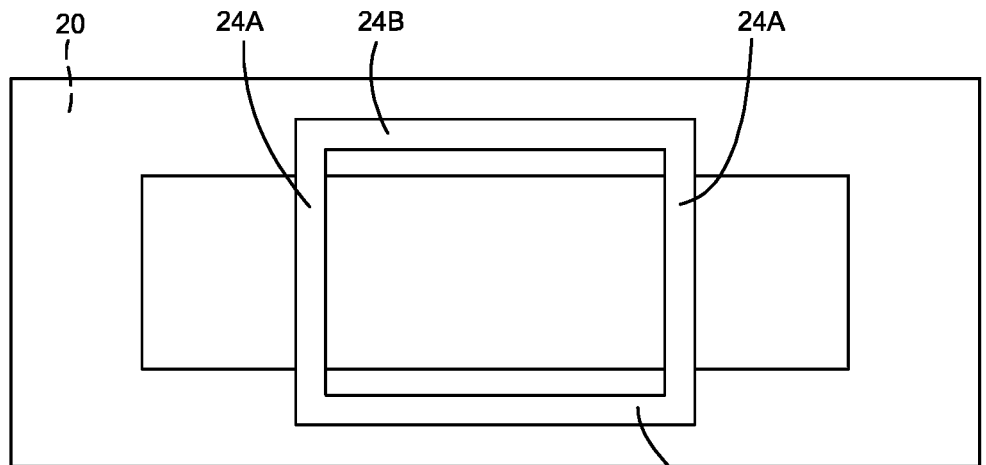
Figure 7B:
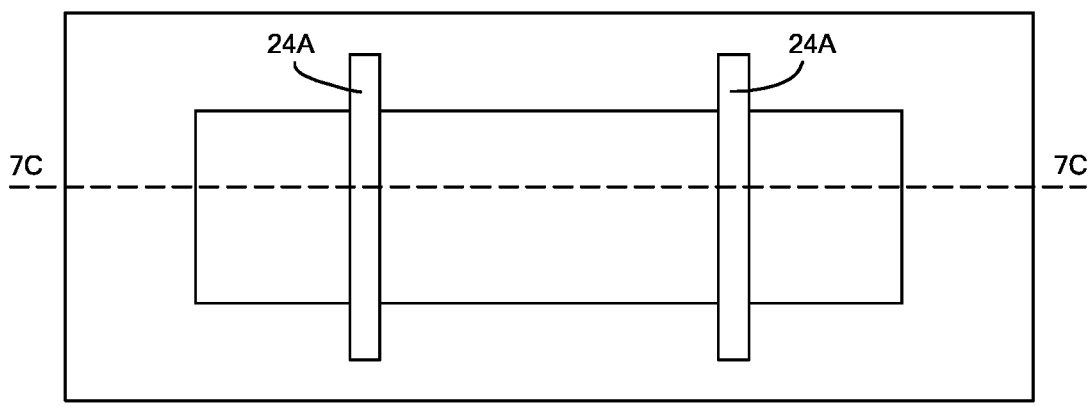
Figure 7C:
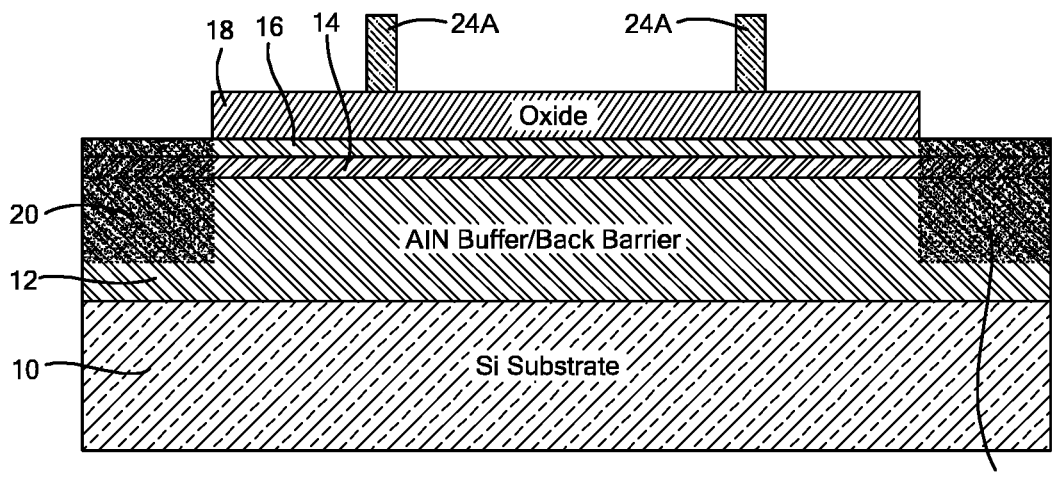

Referring to FIGS. 6 and 6A, portions of the dielectric spacer layer 24 are removed from the upper surface of the mandrel 22 and upper surface portions of the oxide layer 18 using a directional etch by plasma, Inductive Coupled Plasma (ICP) etch or Reactive Ion Etch (RIE) to produce the structure as shown Referring to FIG. 7A, the mandrel 22 is removed by selective wet or dry etching and then a trim masking lithographic process is used to remove a pair of opposing dielectric spacer layer 24B while leaving the other pair of opposing dielectric spacer layer 24A, as shown in FIGS. 7A, 7B and 7C.

Figure 8:
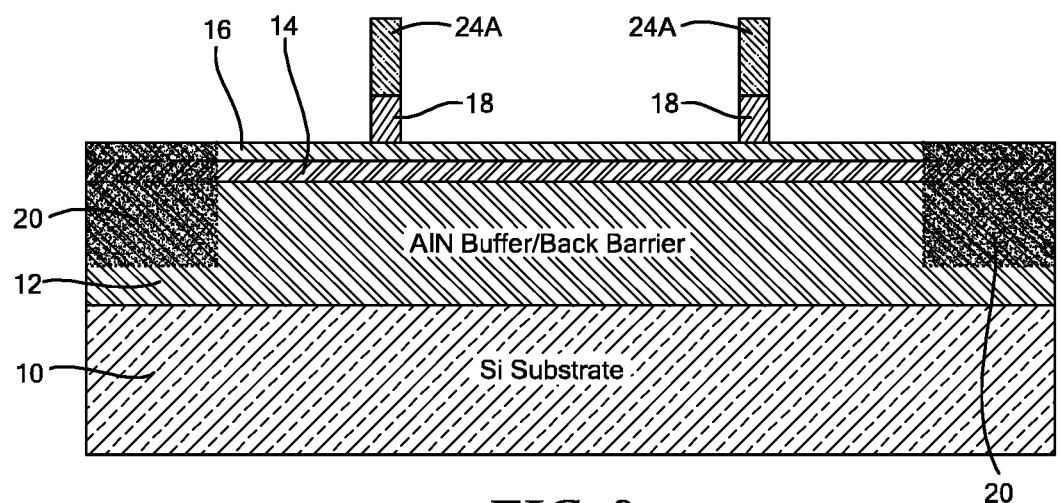
Figure 8A:
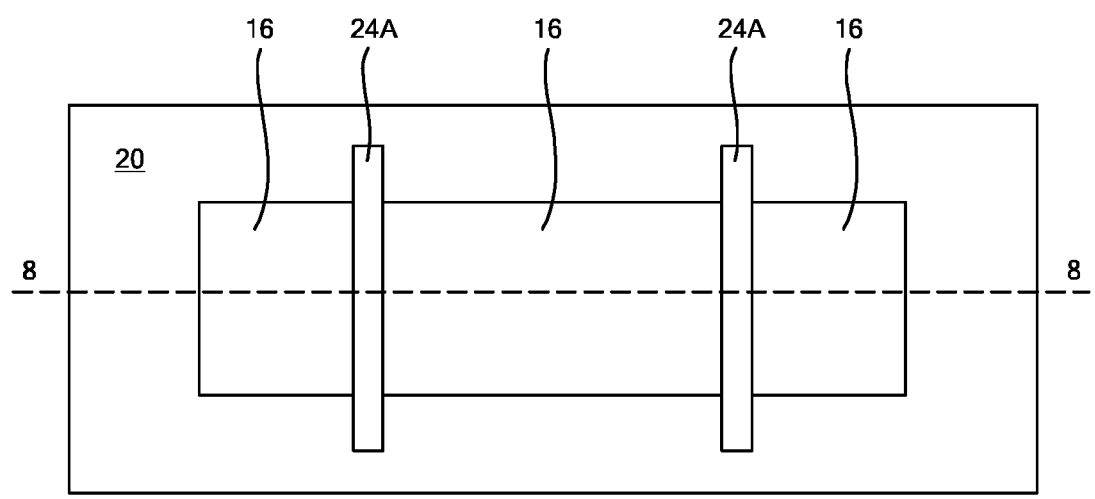

Referring to FIGS. 8 and 8A, the exposed portions silicon oxide layer 18 are removed, here for example by plasma etching exposing the top portion of the GaN epitaxial layer 14; it being noted that the portion of the silicon oxide layer 18 under the of the dielectric spacer layer 24 remain, as shown.

Figure 9:
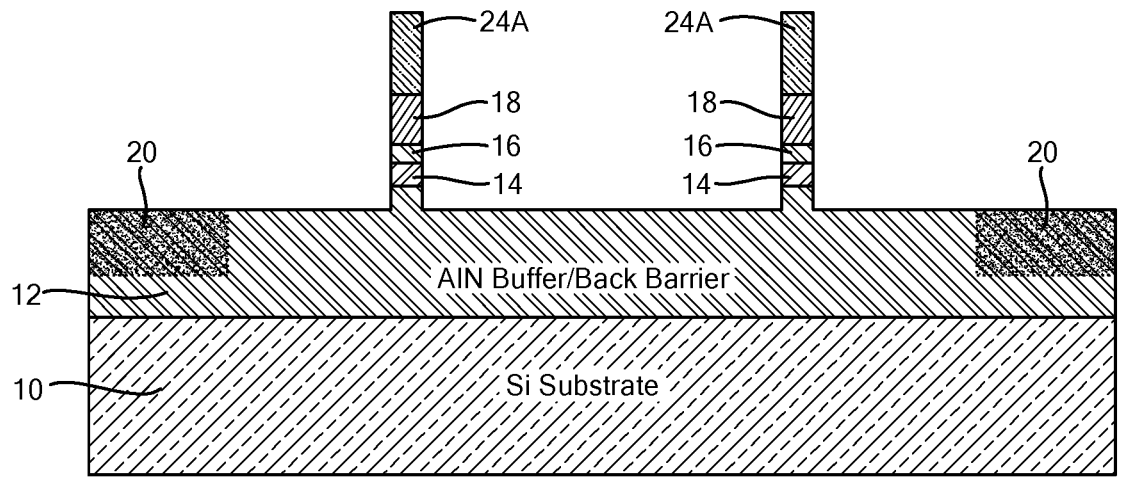

Referring now to FIG. 9, portions of the then expose portions of the AlGaN layer 16 are removed followed by removal of the then exposed portion of the GaN layer 14, followed by removal of the then exposed upper portions of the AlN layer 12; here by selective wet or dry etching; it being noted that the portions of the AlGaN layer 16, portions of the GaN layer 14 and portions of the AlN layer 12 under the dielectric spacer layer 12, as well as portions of the isolation regions 20 remain, as shown.

Figure 10:
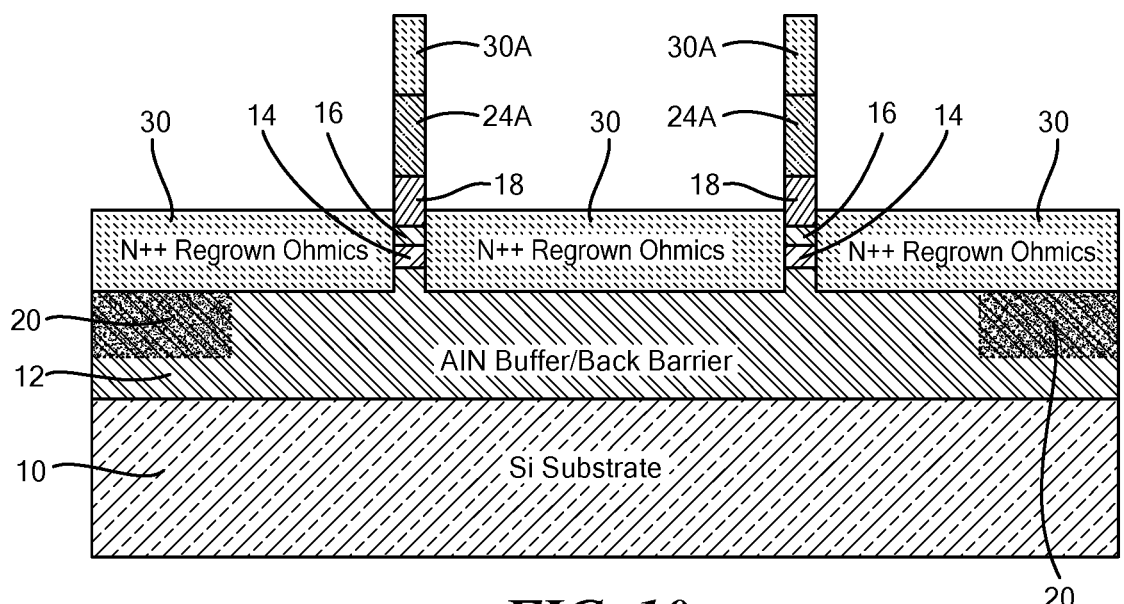

Referring now to FIG. 10, a layer 30 of N++ doped of GaN; a so-called regrown layer, is formed over the exposed portions of the AlN layer 12 and with portions 30A being deposited over the dielectric spacer layer 24, as shown using molecular beam epitaxy or Metal-Organic Chemical Vapor Deposition (MOCVD).

Figure 11:
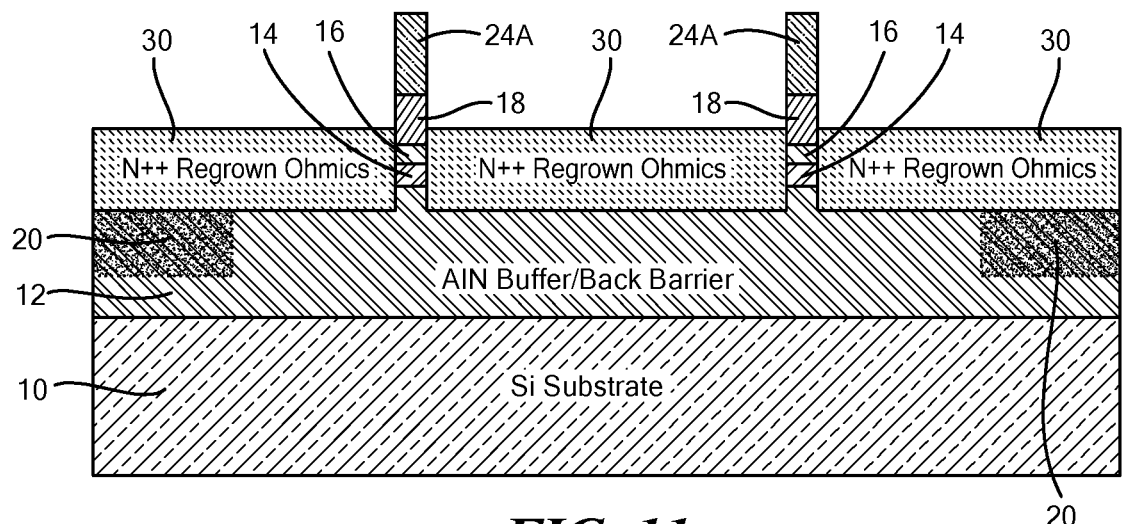
Figure 12:
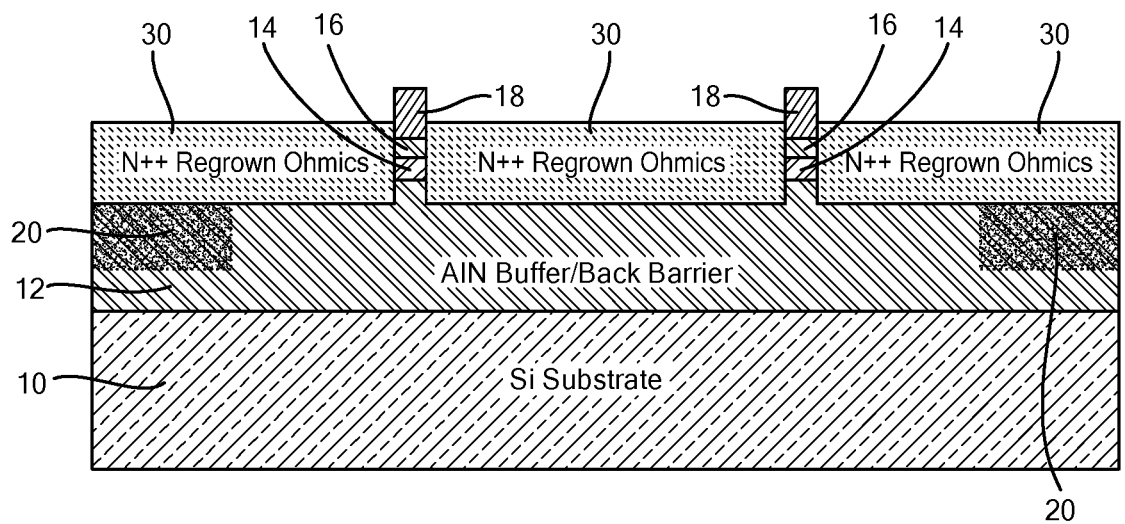

Referring now to FIG. 11, a wet or dry selective polycrystalline GaN etch is use to remove the portion deposited over the dielectric spacer layer 24 resulting in the structure shown in FIG. 12.

Figure 12A:
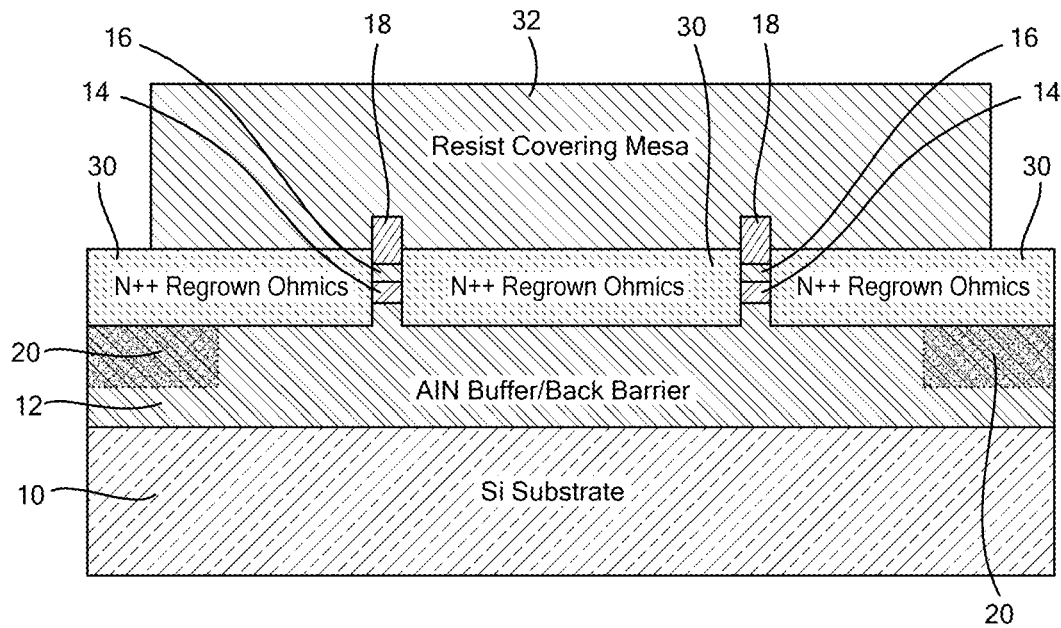
Figure 13:
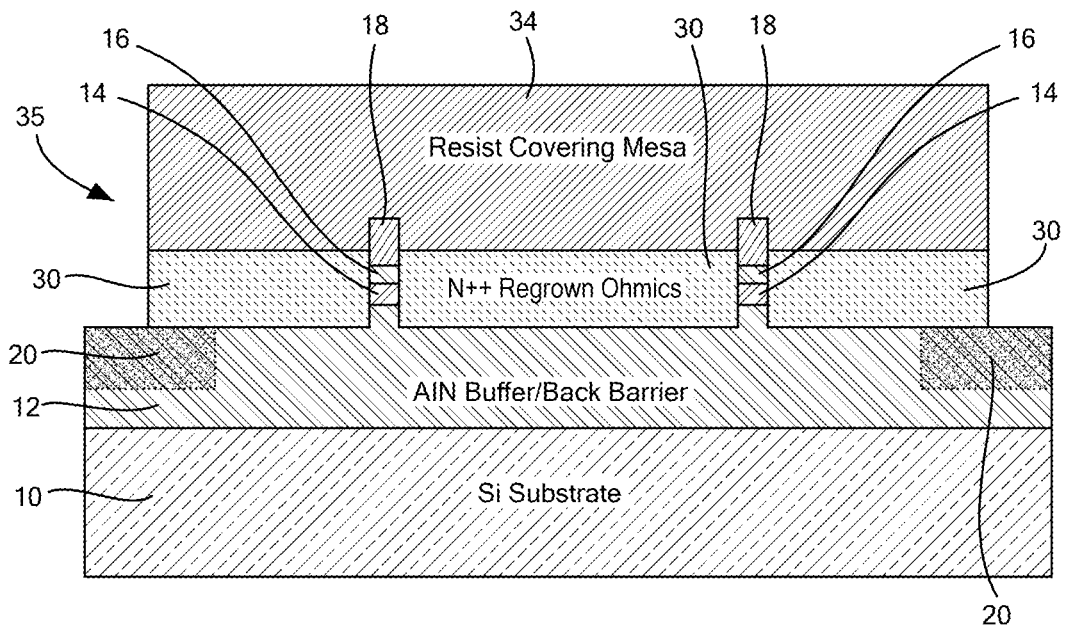
Figure 13A:
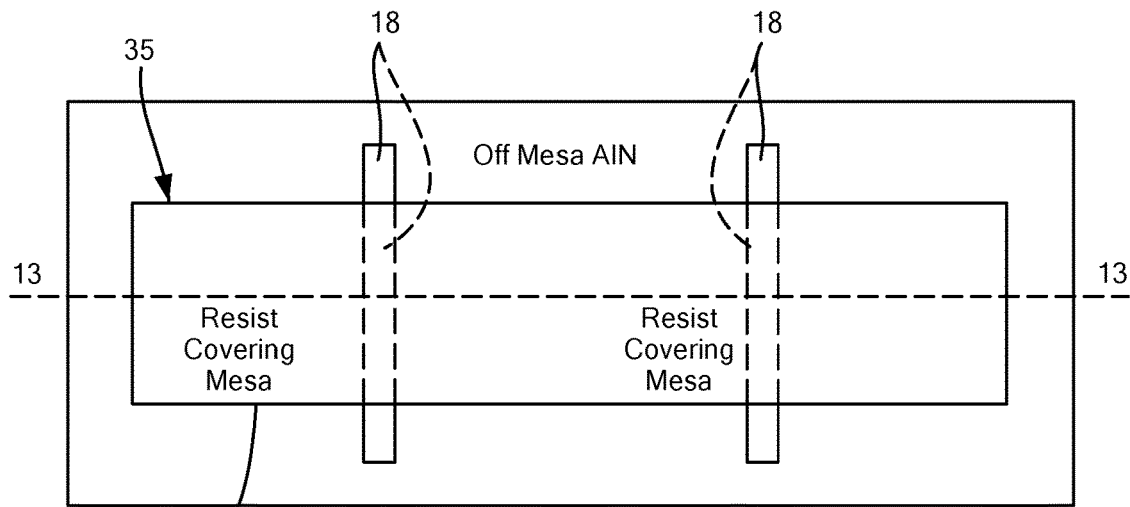
Figure 14:
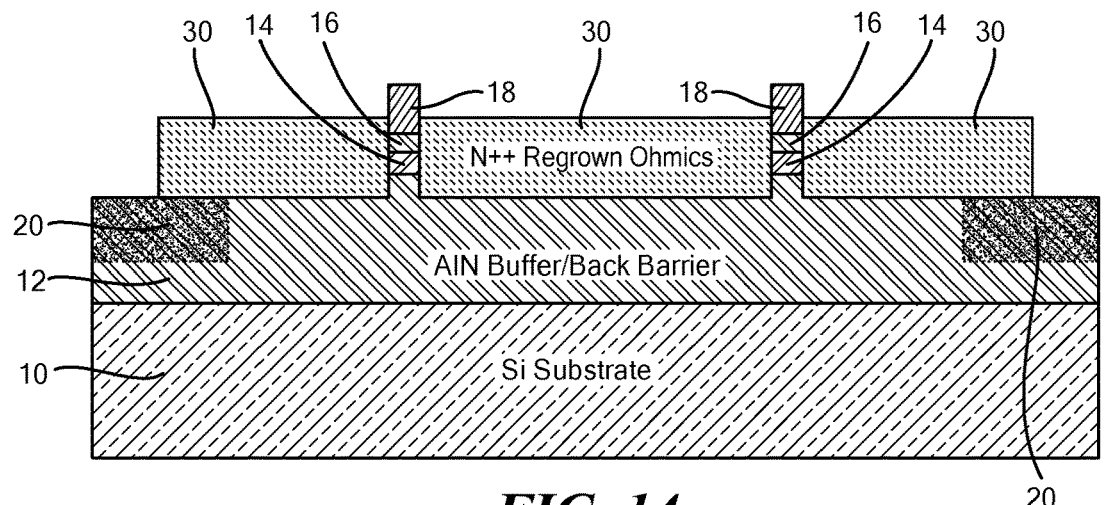
Figure 14A:
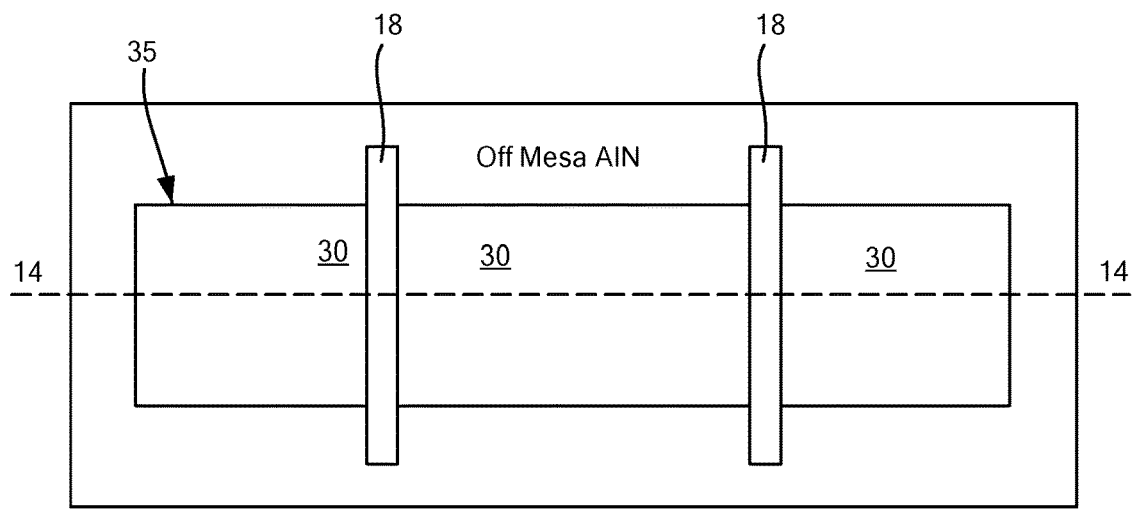

Referring to FIG. 12A, a photoresist layer 32 is formed over a portion of the structure for the purpose of exposing a portion 30 of the N++ regrown Ohmics layer 30; it being noted that the photoresist layer 32 has ends thereof extending over a portion of the implanted regions 20, as shown in FIG. 12A, A suitable wet or plasma etching process, is used to etch and remove exposed portions 30 of the Regrown Ohmics layer 30, FIGS. 13 and 13A. The then exposed portions of dielectric spacer layer 24 and the photoresist layer 32 is removed resulting in structure shown in FIGS. 14 and 14A.

Figure 15A:
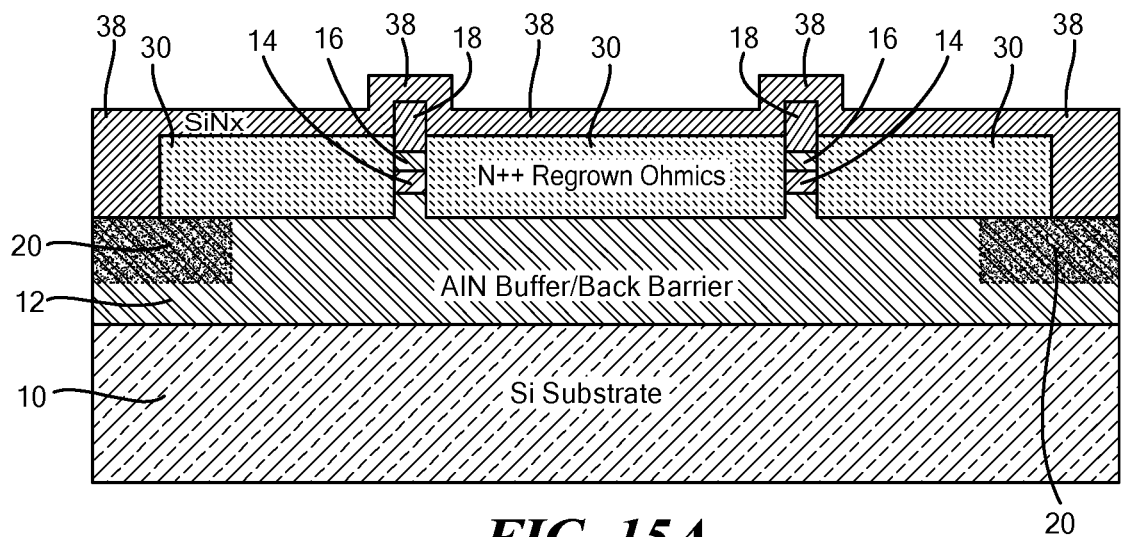
Figure 15B:
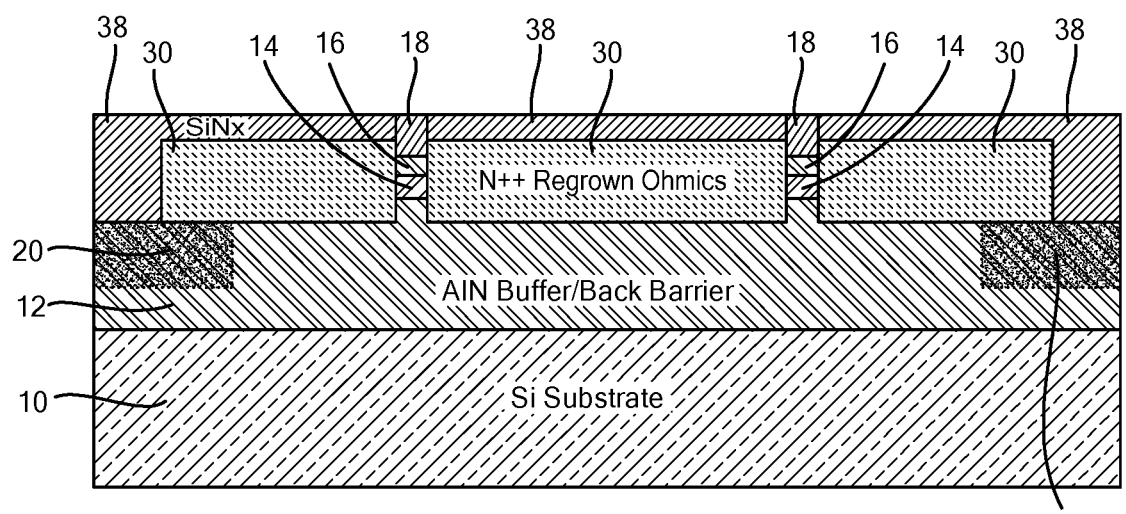

Referring to FIG. 15A, a thin dielectric layer 38, here for example, SiNx, is formed over the surface and then chemical mechanical polished exposing the upper portions of silicon dioxide layer 18 are exposed, as shown in 15B.

Referring to FIG. 16, the exposed portions of silicon dioxide layer 18 are removed by selective wet or dry etching thereby exposing underlying portions of the AlGaN layer 16, as shown.

Figure 16A:
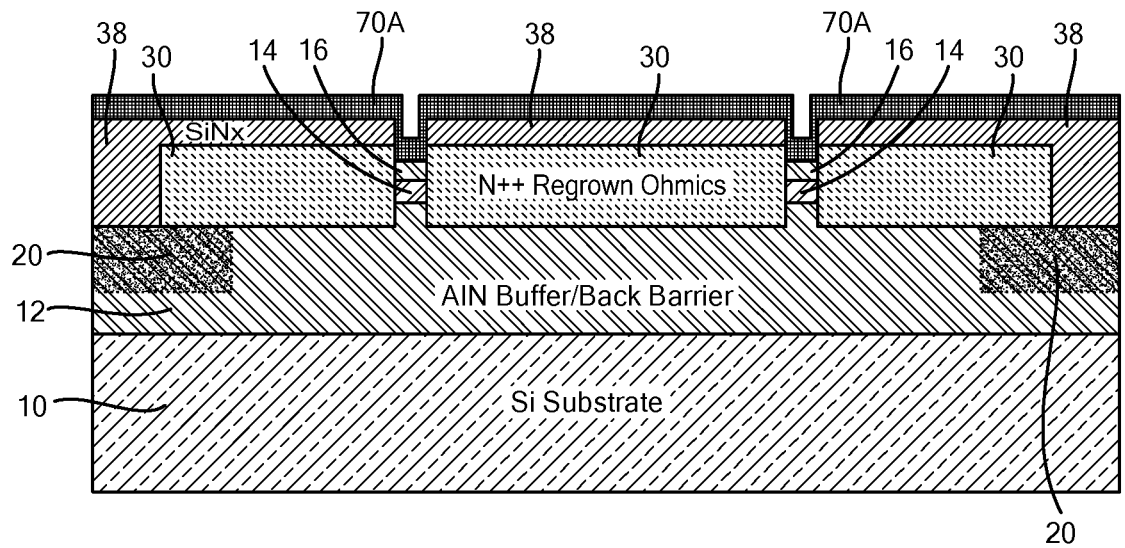
Figure 16B:
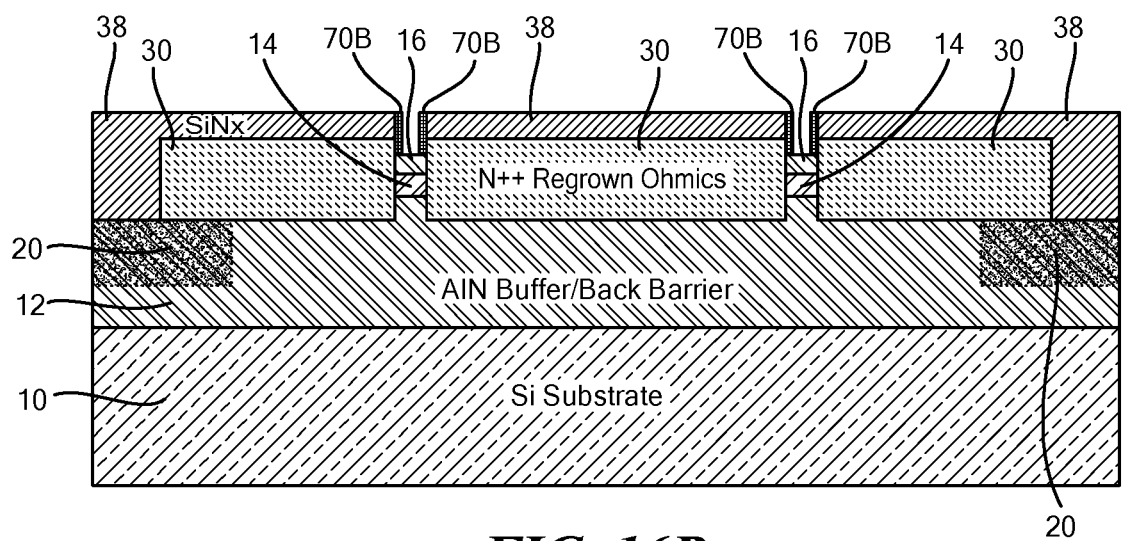

Referring to FIG. 16A, a dielectric liner material 70A, for example SiNx or $Al_2O_3$, is first conformally deposited over the structure and then directionally etched as shown in FIG. 16B, leaving portions 70B of the dielectric liner layer on the sidewalls of the regrown Ohmic layer 30 and on the gate opening, as shown in FIG. 16B.

Figure 17A:
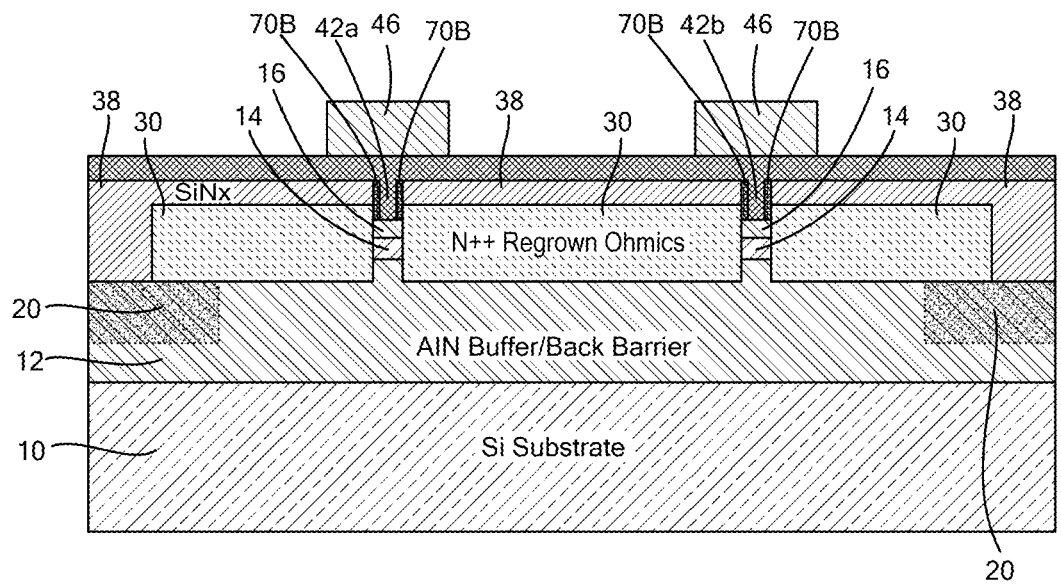
Figure 17B:
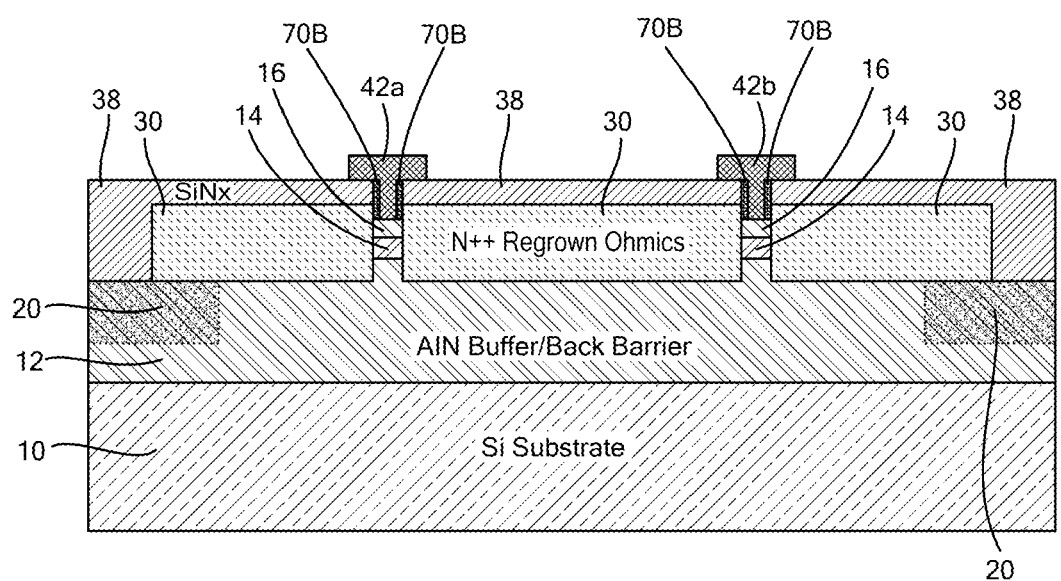

Referring now to FIG. 17A, a gate metal layer 42a, for example a lower layer of Titanium Nitride (TiN) and upper layer of Tungsten (W), is sputter deposited over the structure, as shown. A photoresist a mask 46 is used with a dry etch, to pattern layer 42a into a pair of Schottky gate metal contact 42a, 42b, as shown in FIG. 17B.

Figure 18A:
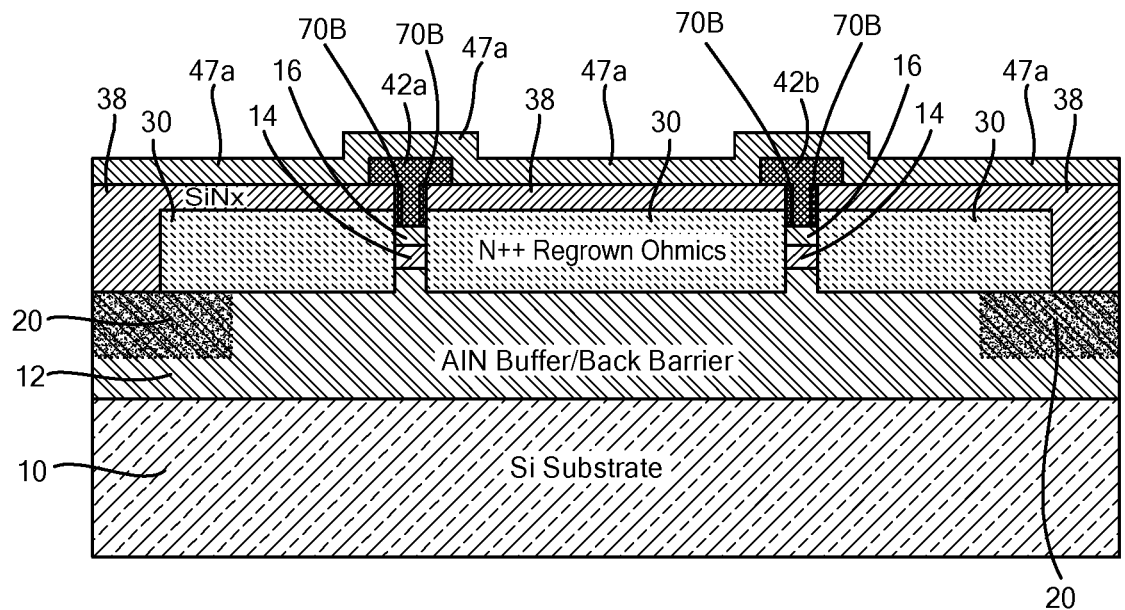

Referring now to FIGS. 18A-18I, a process is described to form a pair of source contacts 50S and a drain contact 50D (FIG. 18D, I) as damascene structures, here, for example, Damascene structures, in ohmic contact with N++ regrown Ohmics brides layer 30. Thus, referring to FIG. 18A, an additional silicon nitride (SiNx) stop etch layer 47a is deposited over SiNx layer 38 and over the pair of Schottky gate metal contacts 42a and 42b as shown in FIG. 18A.

Figure 18B:
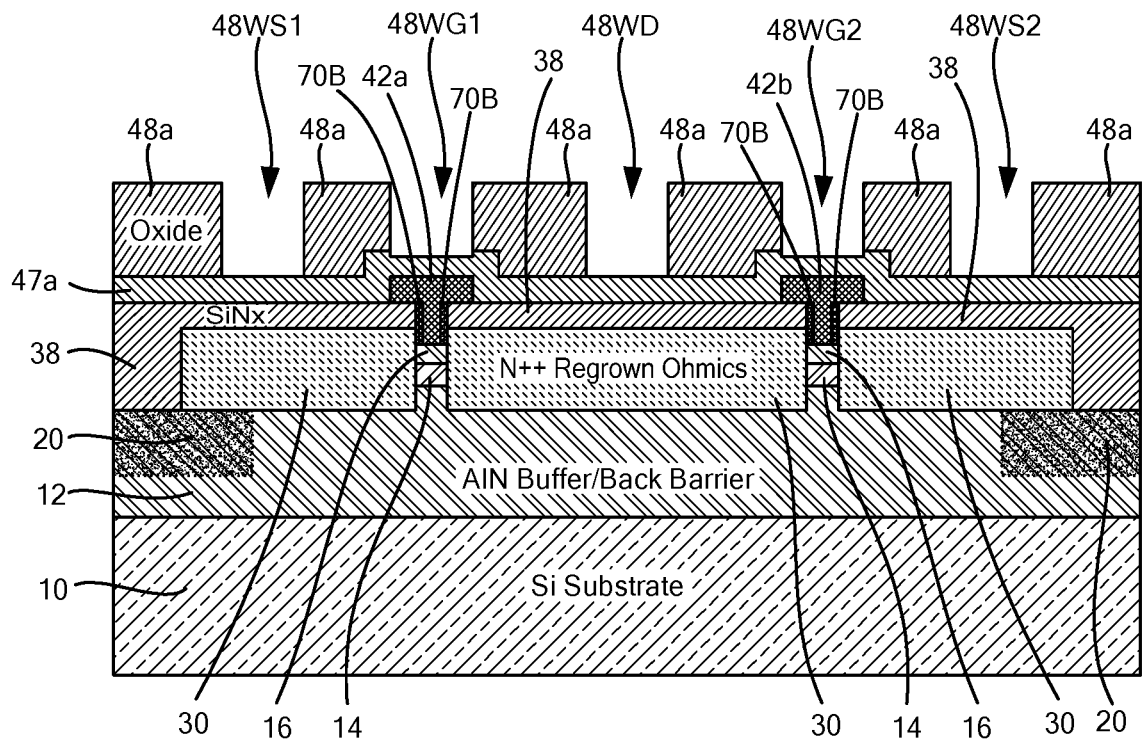
Figure 18C:
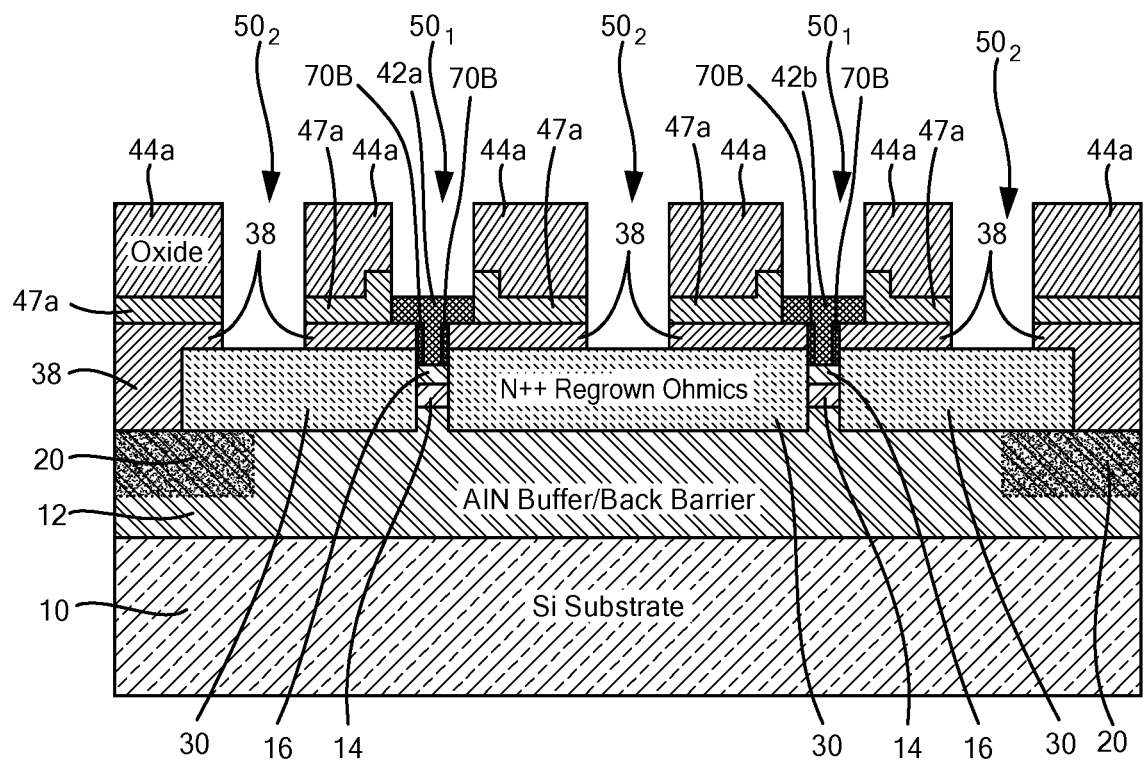
Figure 18D:
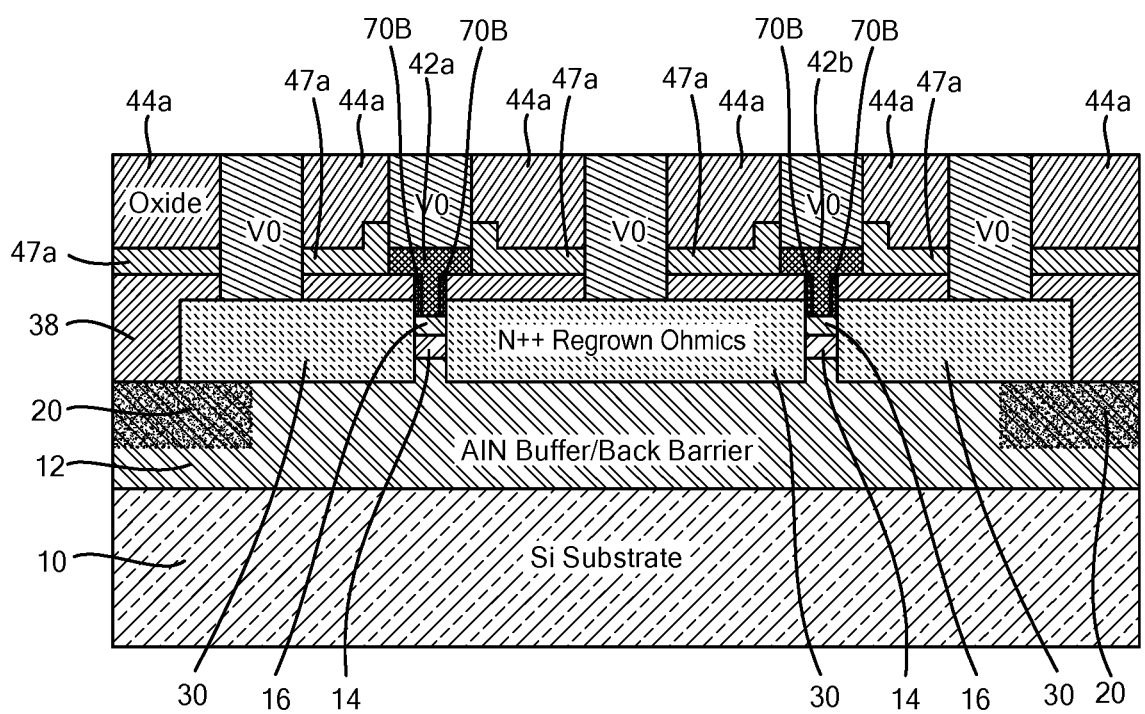
Figure 18E:
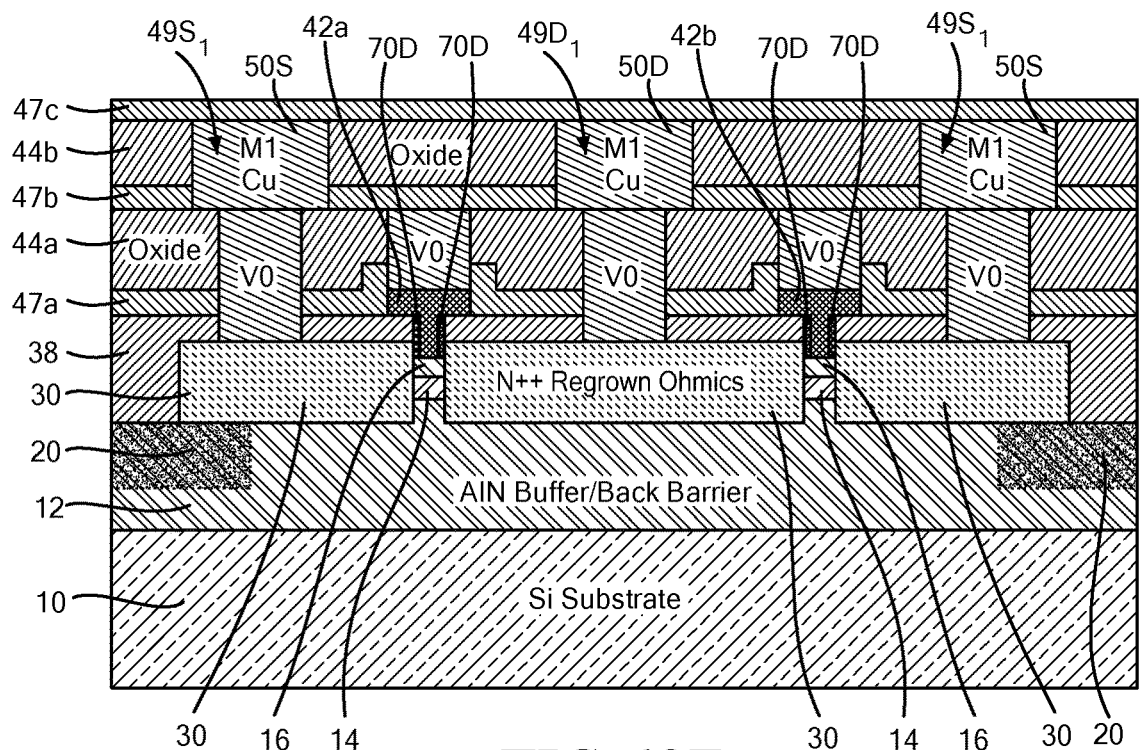
Figure 18F:
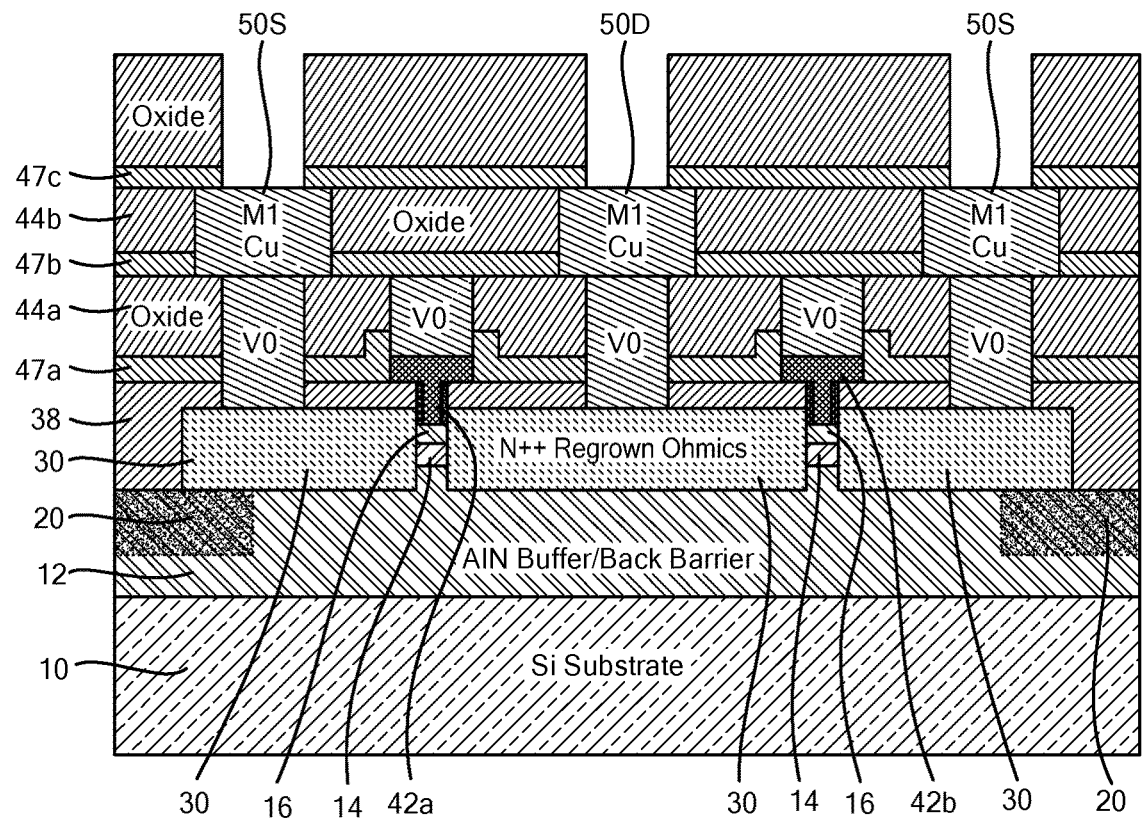
Figure 18G:
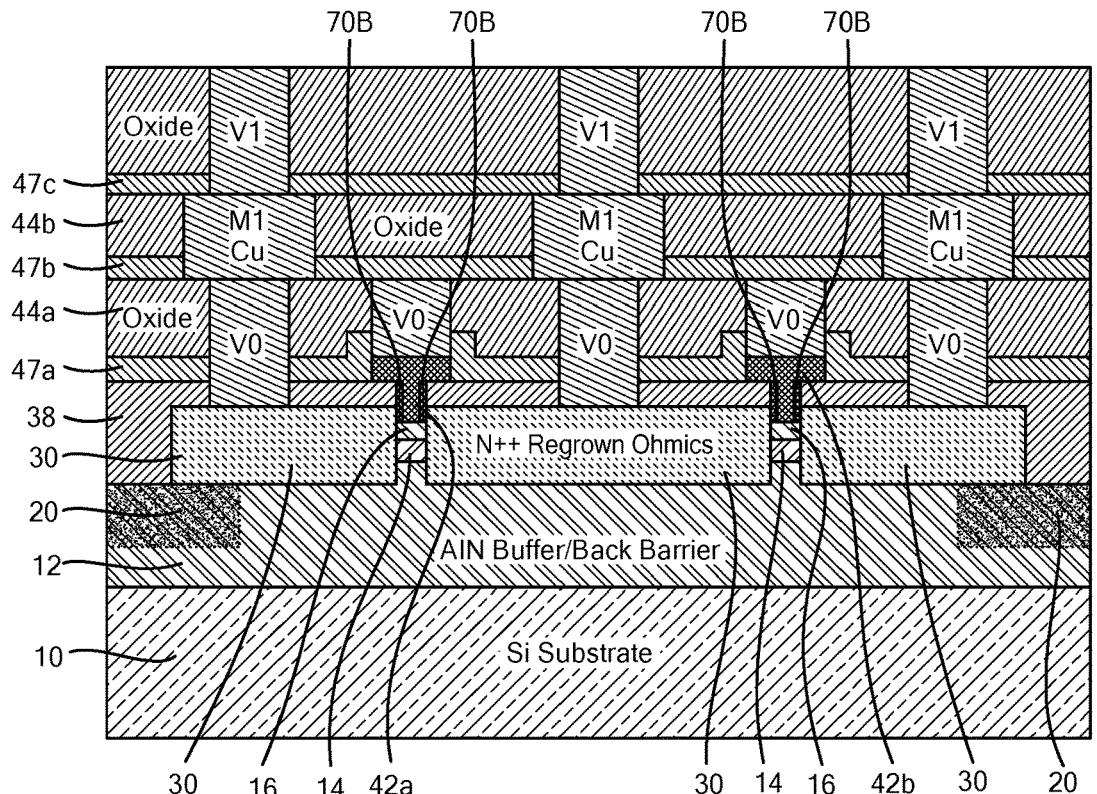
Figure 18H:
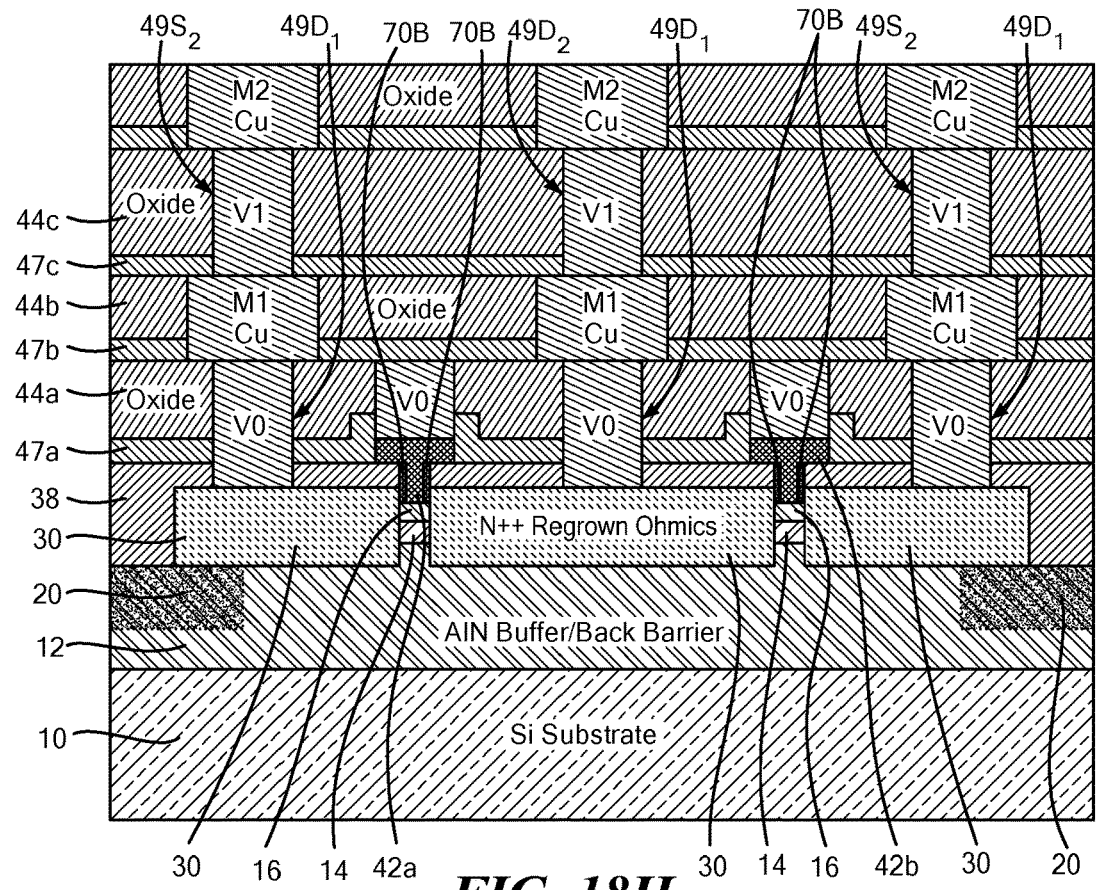
Figure 18I:
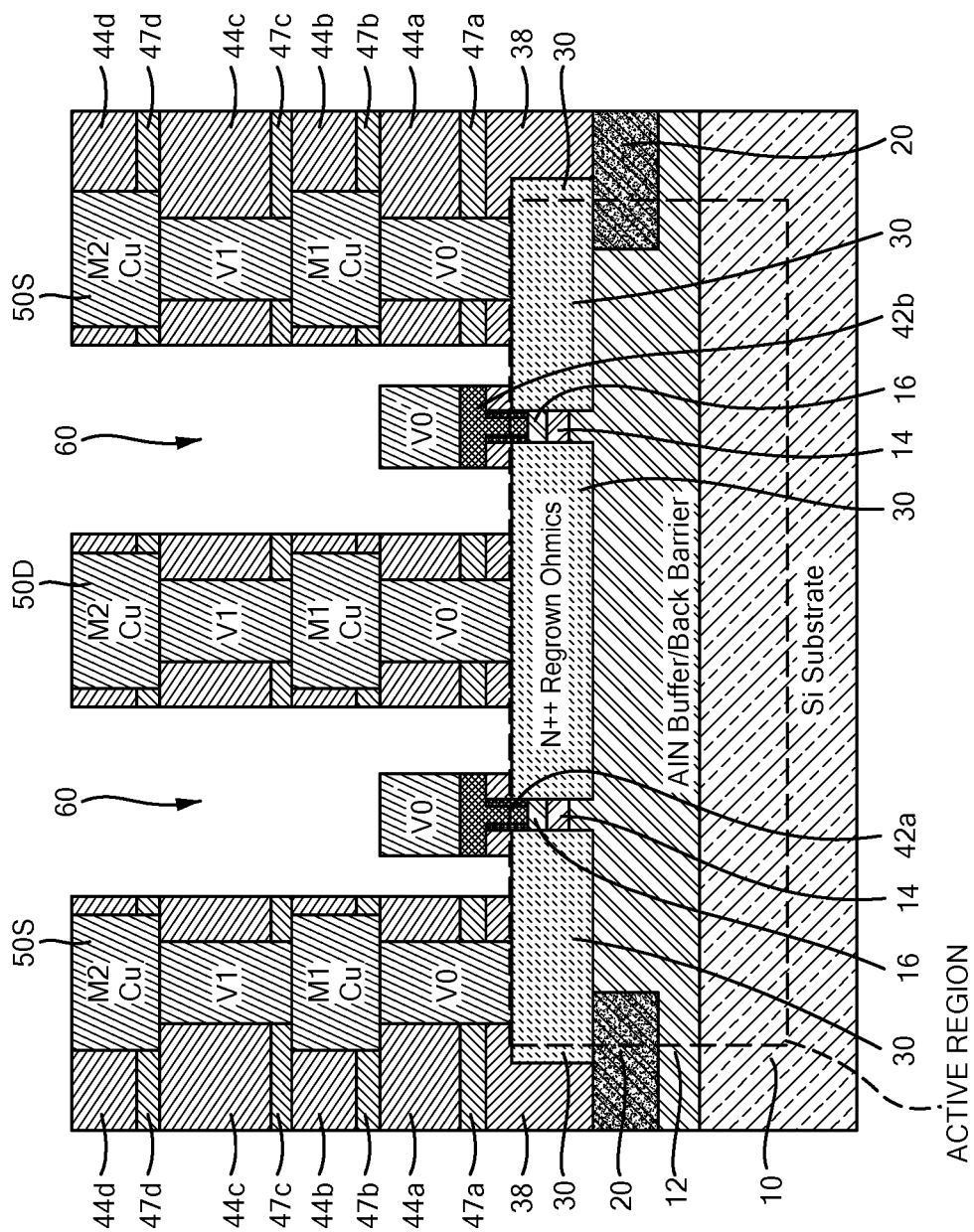

Referring to FIG. 18B, a dielectric layer 48a, here for example, silicon dioxide, is deposited by chemical vapor deposition (CVD) over SiNx layer 47a, planarized by Chemical Mechanical Planarization (CMP), and photolithographically pattern and etched to first form a pair of windows 48WG1 and 48WG2 for the gate contacts 42a, 42b (FIG. 18B) and then windows 48WS1, 48WS2, 48WD, for the pair of source contacts 50S and drain contact 50D (FIG. 18D, 18I). The exposed portions of the SiNx layer 47 are removed to form widows $50_1$, $50_2$ (FIG. 18C), to expose the gate and portions of the N++ regrown Ohmics layer 30 where the pair of source contacts 50S, a drain contact 50D, and two gate contacts 50G are to be formed by an additional plating and chemical mechanical polish (CMP) of Metal layer $V_O$ (here copper) in windows $50_1$, $50_2$ as shown in FIG. 18D.

Referring to FIG. 18E, in a similar manner a dielectric layer 47b, here for example, silicon nitride followed by a layer 44b of silicon dioxide are deposited; windows, not shown, are formed therein and upper metal layers M1, here copper, are deposited through the windows onto metal layers $V_O$, as shown; followed by another layer 47c of silicon nitride, as shown in FIG. 18E to form damascene structures $49S_1$, $49D_1$ in contact with lower part of the source and drain contact, S and D, respectively, (FIG. 18H).

The process repeats, as shown in FIGS. 18G and 18H, to form damascene structures $49S_2$, $49D_2$ for the upper part of the source and drain contact, S and D, respectively, FIG. 18H.

Next, air gaps 60 are etched into the structure using conventional photolithographic etching techniques to form the structure shown in FIG. 18I.

As noted above, here the source and drain contacts 50S and 50D (FIG. 18I) are formed as damascene structures dielectric layers of SiNx and SiO are formed as shown in FIG. 18I to provide upper, here copper (Cu) contact metal layers V0, M1, V1, and M2 to the source and drain electrodes 50S and 50D, and gate contacts 42a, 42b (FIG. 18B) as shown in FIG. 18I.

Figure 19:
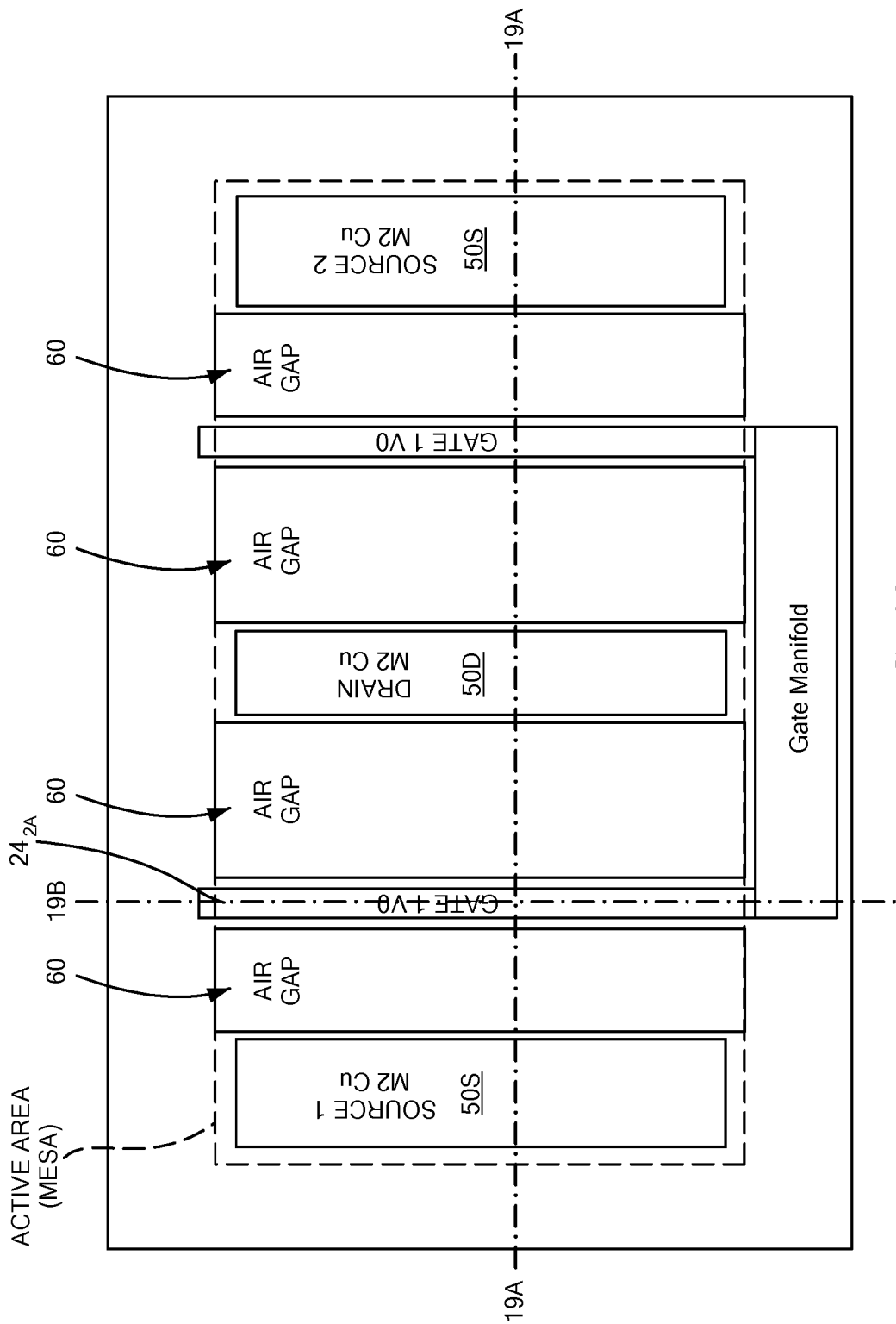
FIG. 19 is a simplified, diagrammatical plan view of the Field Effect Transistor in accordance with the disclosure, FIG. 19A being taken along line 19A-19A in FIG. 19.
Figure 19A:
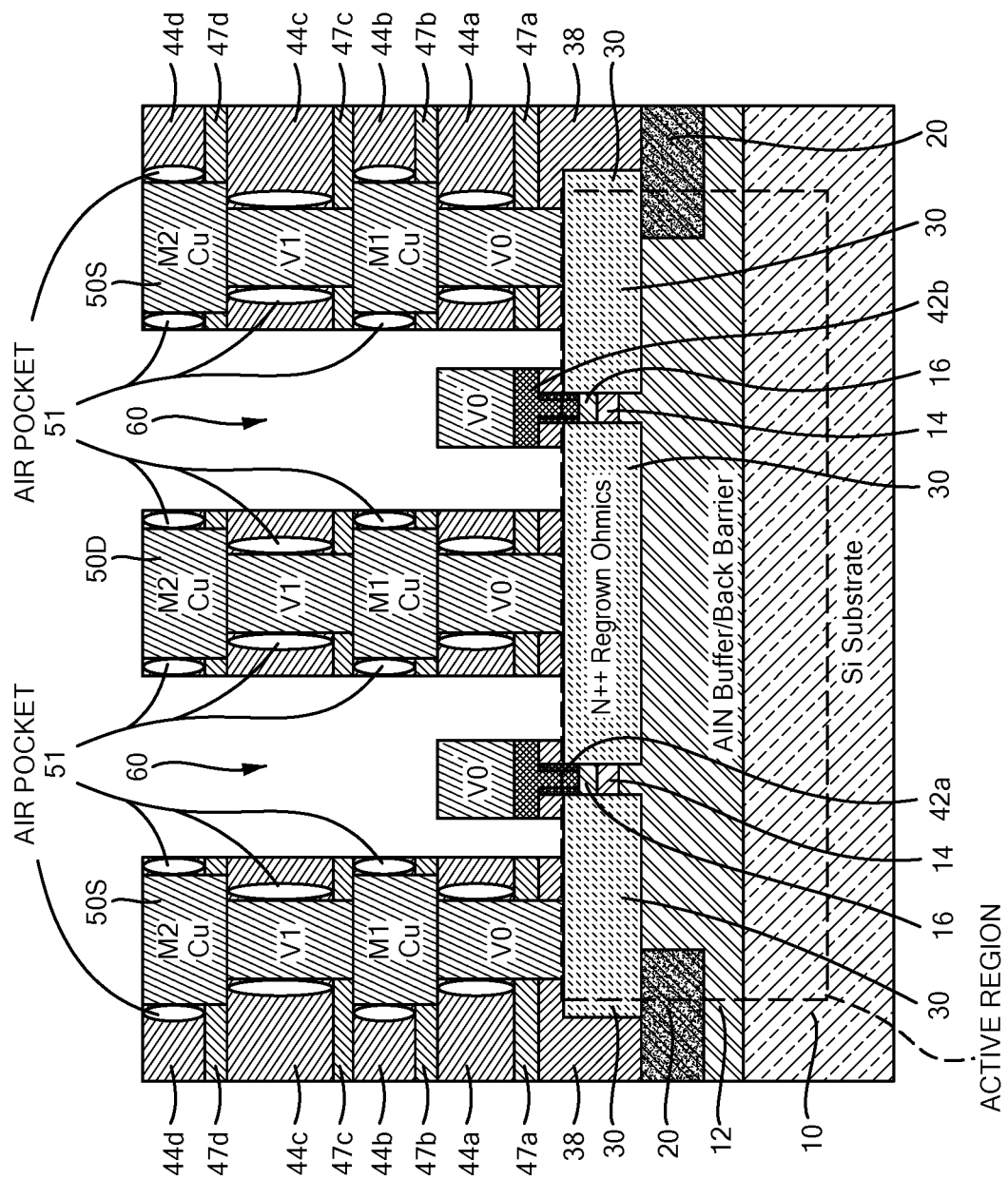
FIG. 19A is a is a simplified, diagrammatical cross-sectional sketch of the Field Effect Transistor in accordance with an alternative embodiment of the disclosure.
Figure 19B:
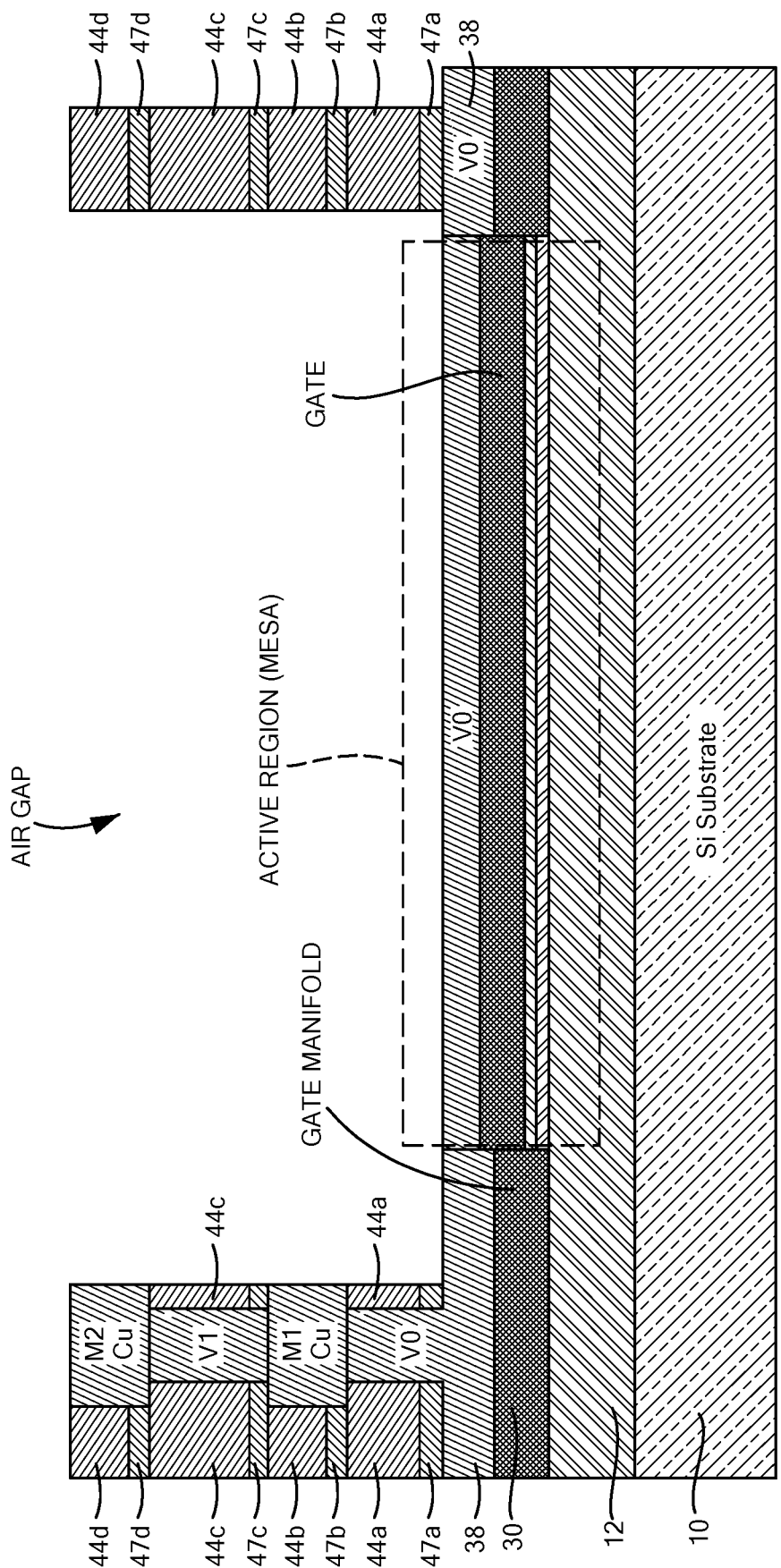
FIG. 19B is a is a simplified, diagrammatical cross-sectional sketch of the Field Effect Transistor in accordance with the disclosure, FIG. 19B being taken along line 19B-19B in FIG. 19.

Referring to FIGS. 19, 19A and 19B an alternative damascene structure with non-conformal damascene oxide that creates air pockets 51 is formed for the source and drain electrodes 50S and 50D.

Figure 20A:
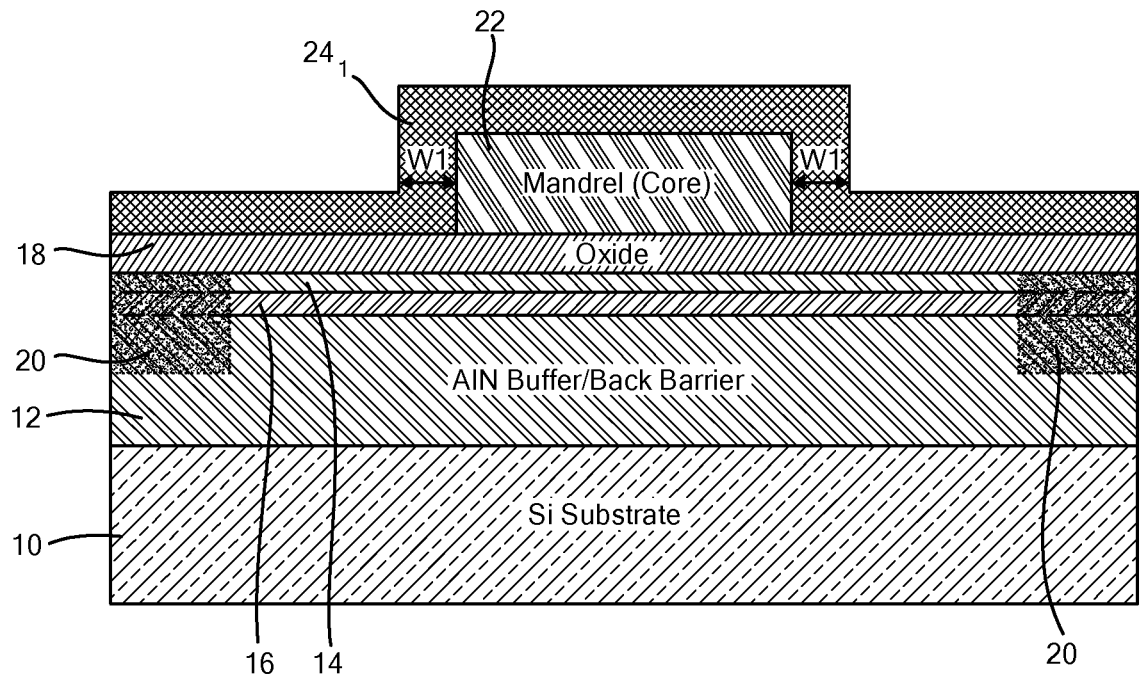
FIGS. 20A-20F, 20J-20W are simplified, diagrammatical cross-sectional sketches of steps used in the formation of a Field Effect Transistor in accordance with a second alternative embodiment of the disclosure.
Figure 20B:
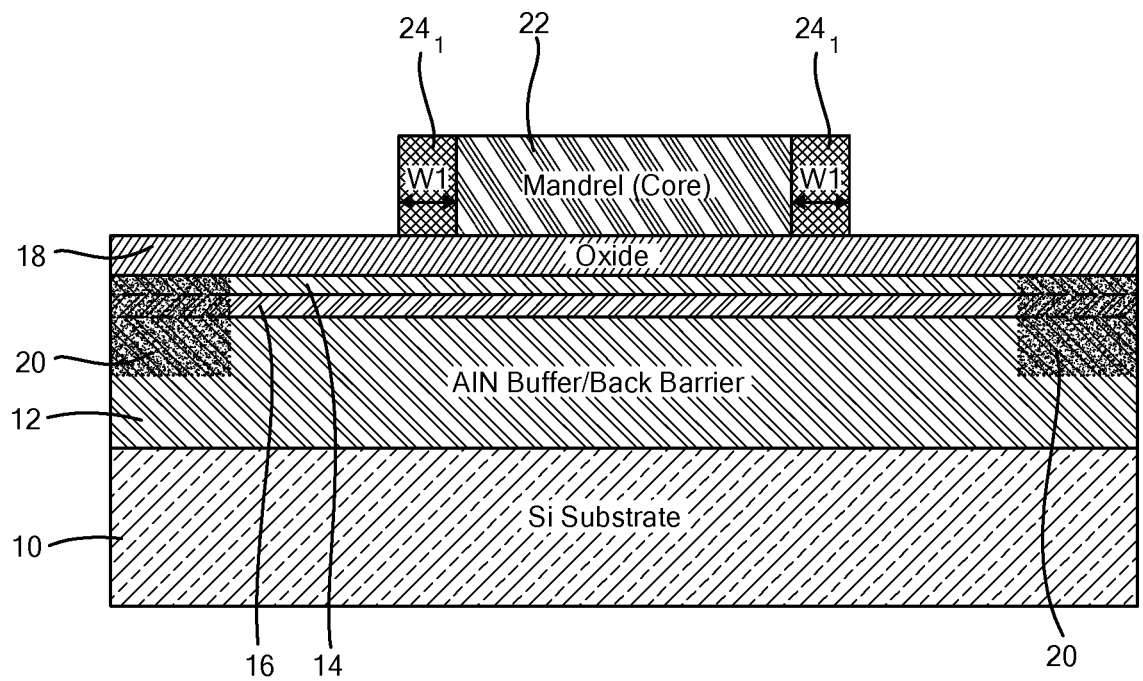
Figure 20C:
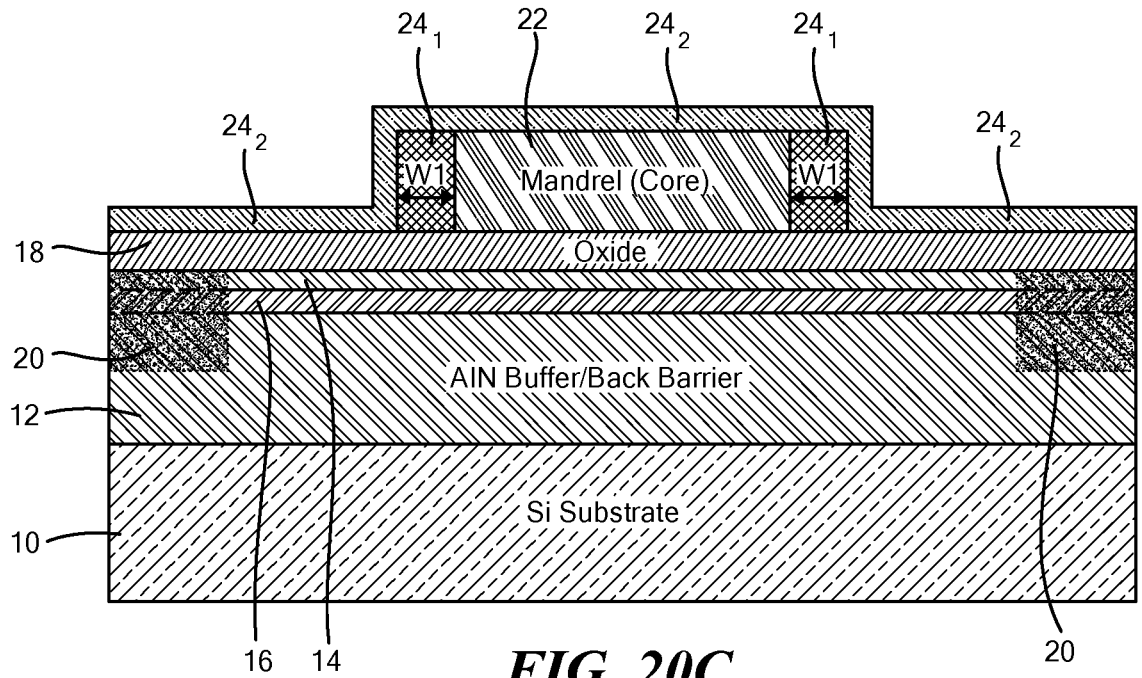
Figure 20D:
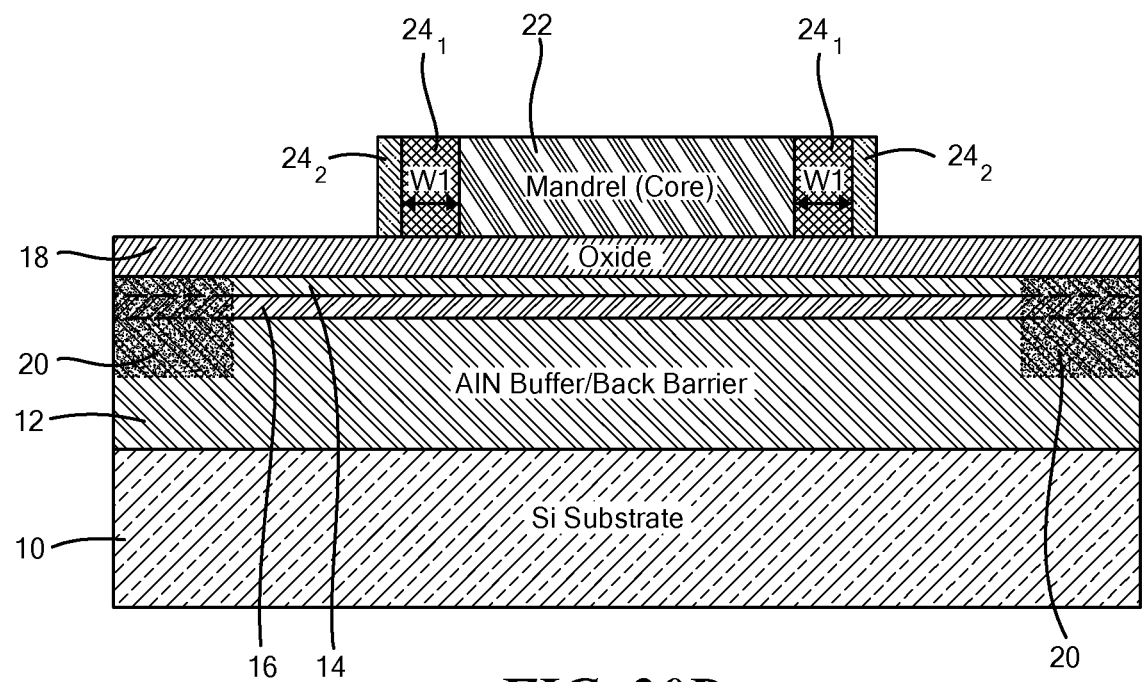
Figure 20E:
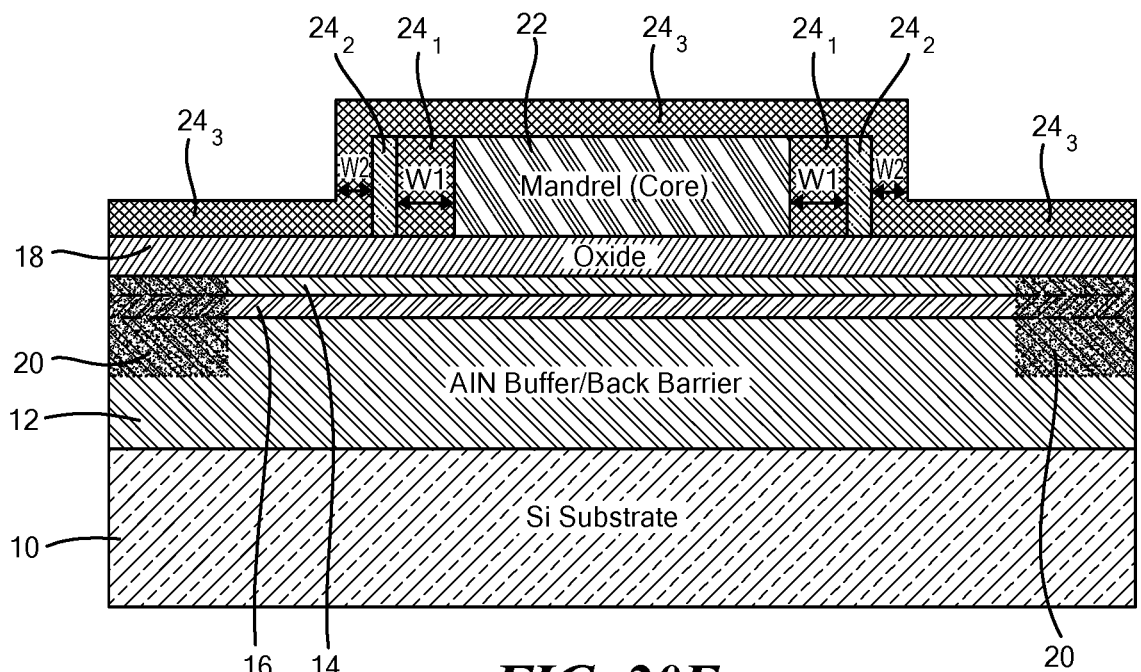
Figure 20F:
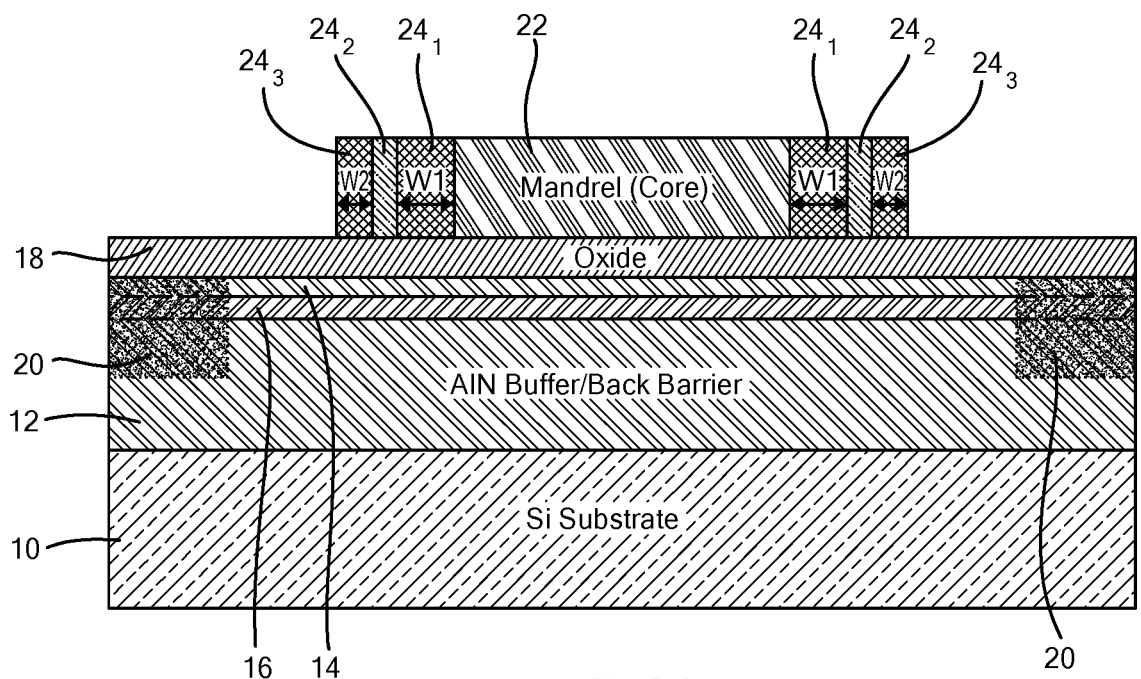
Figure 20G:
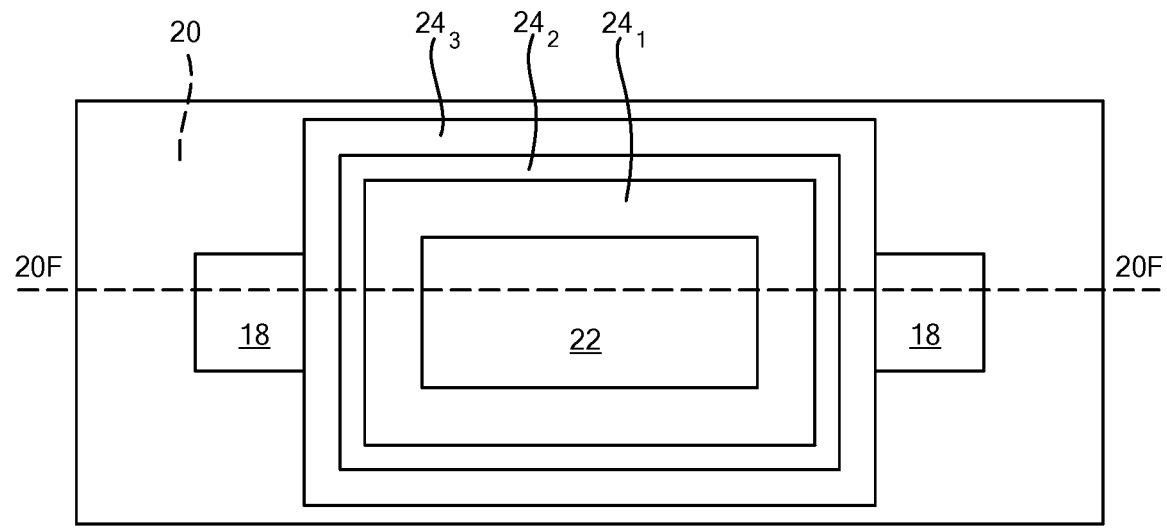
FIGS. 20G, 20H, 20I, and 20X are simplified, diagrammatical plan views of the Field Effect Transistor in accordance with the second alternative embodiment of the disclosure at various stages in the fabrication thereof.
Figure 20H:
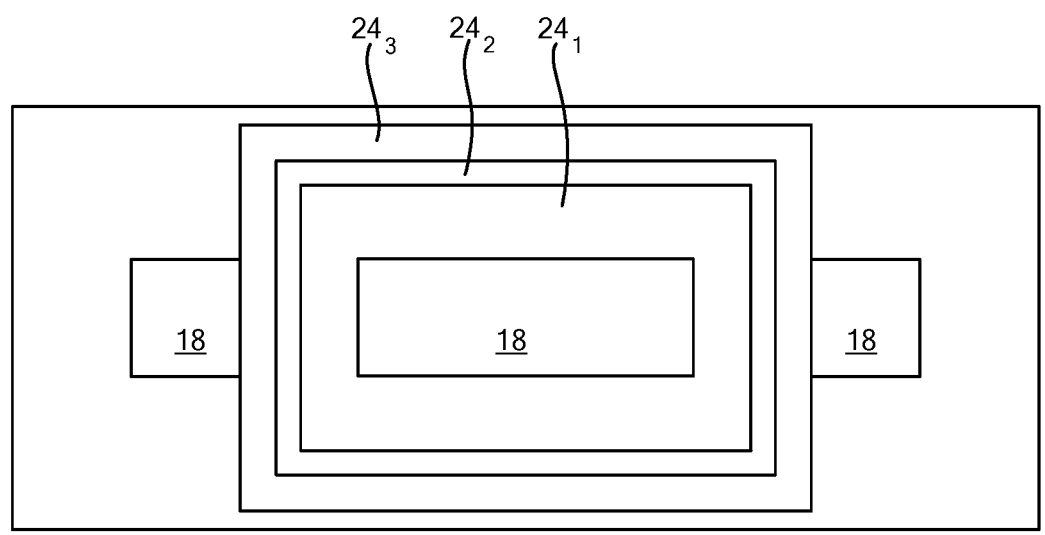
Figure 20I:
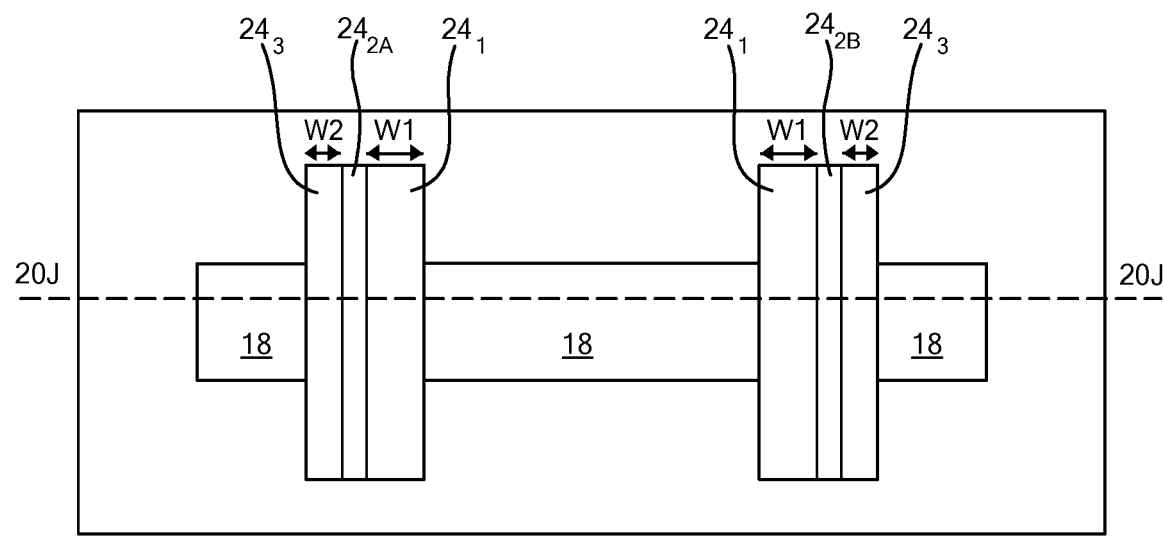
Figure 20J:
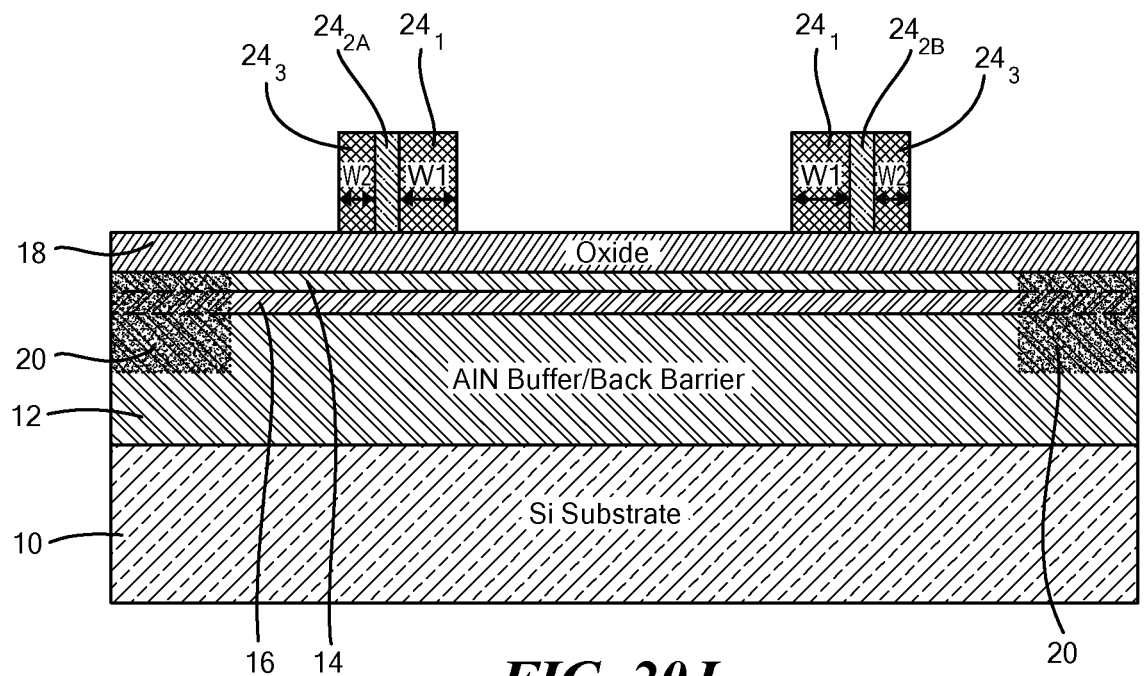
Figure 20K:
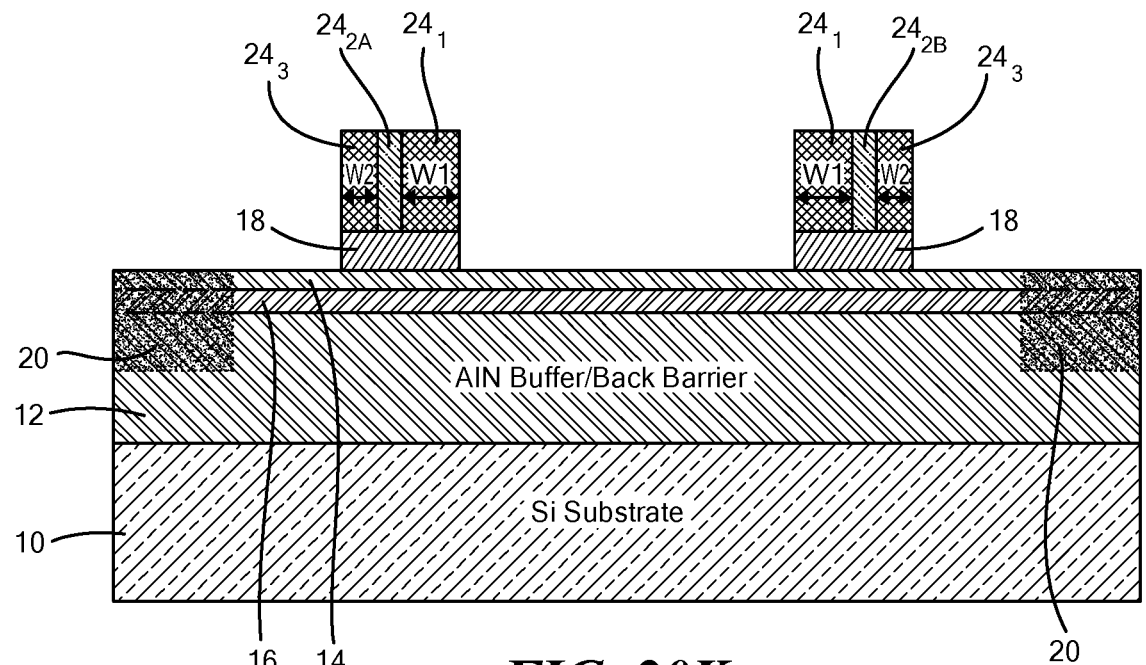
Figure 20L:
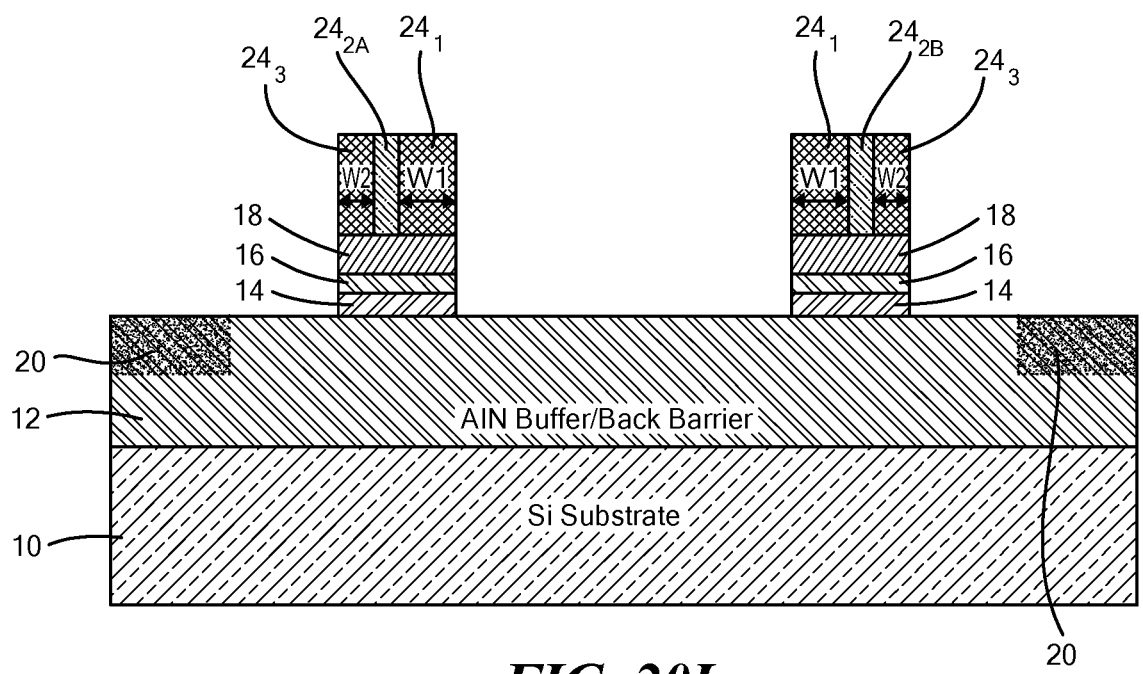
Figure 20M:
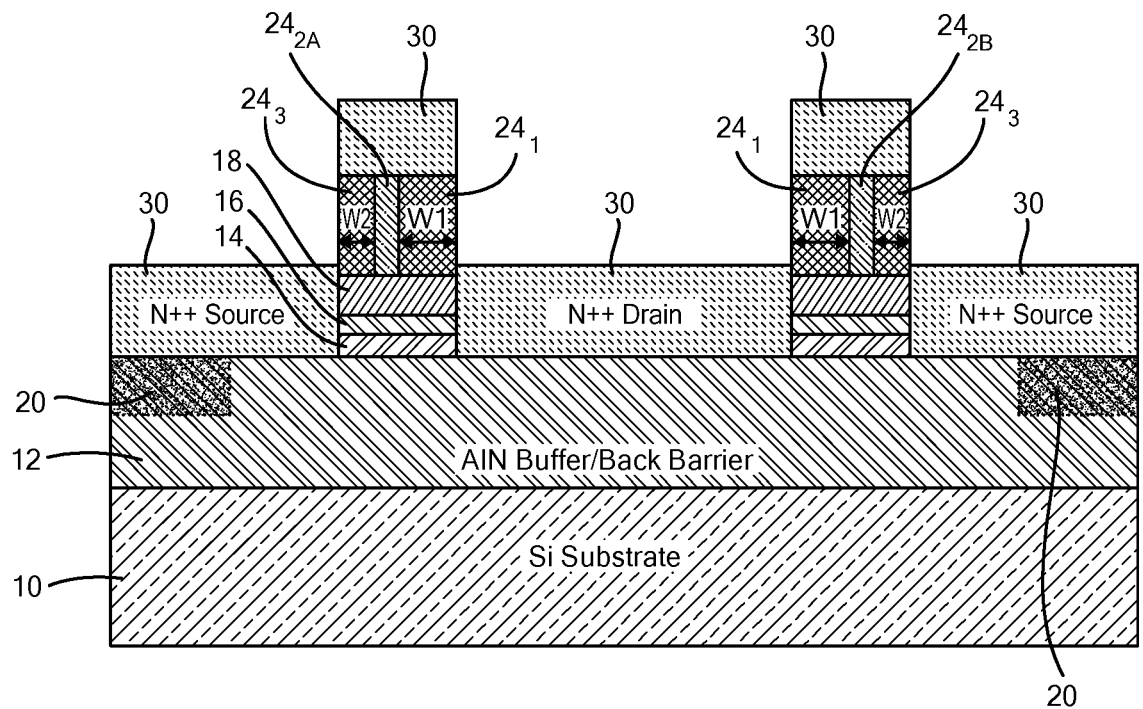
Figure 20N:
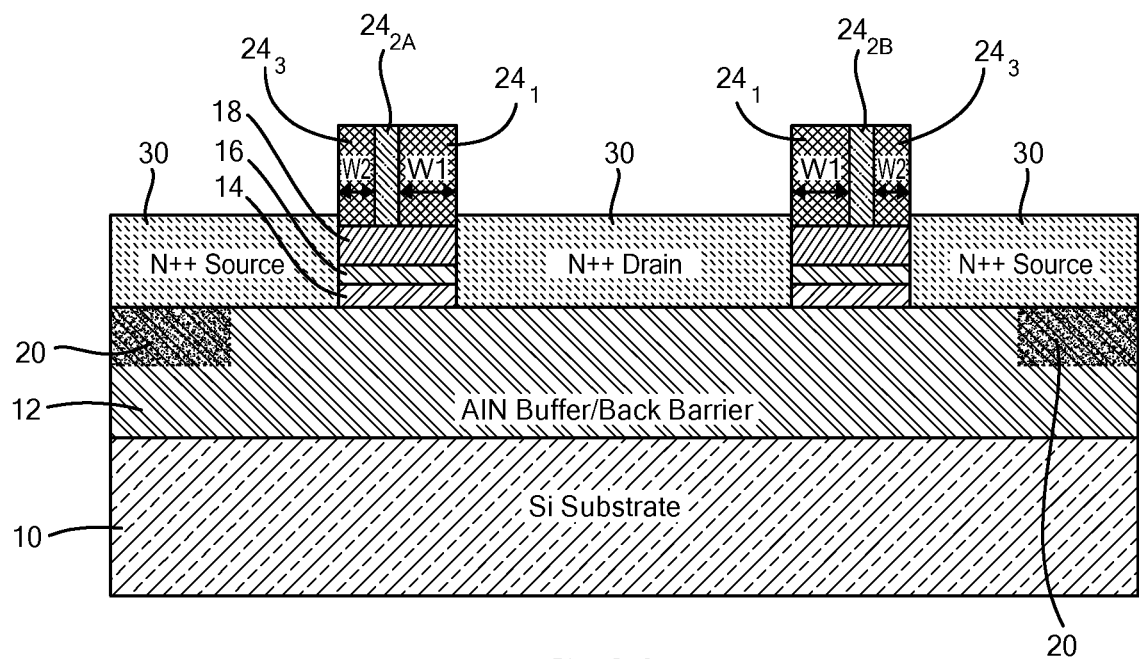
Figure 20O:
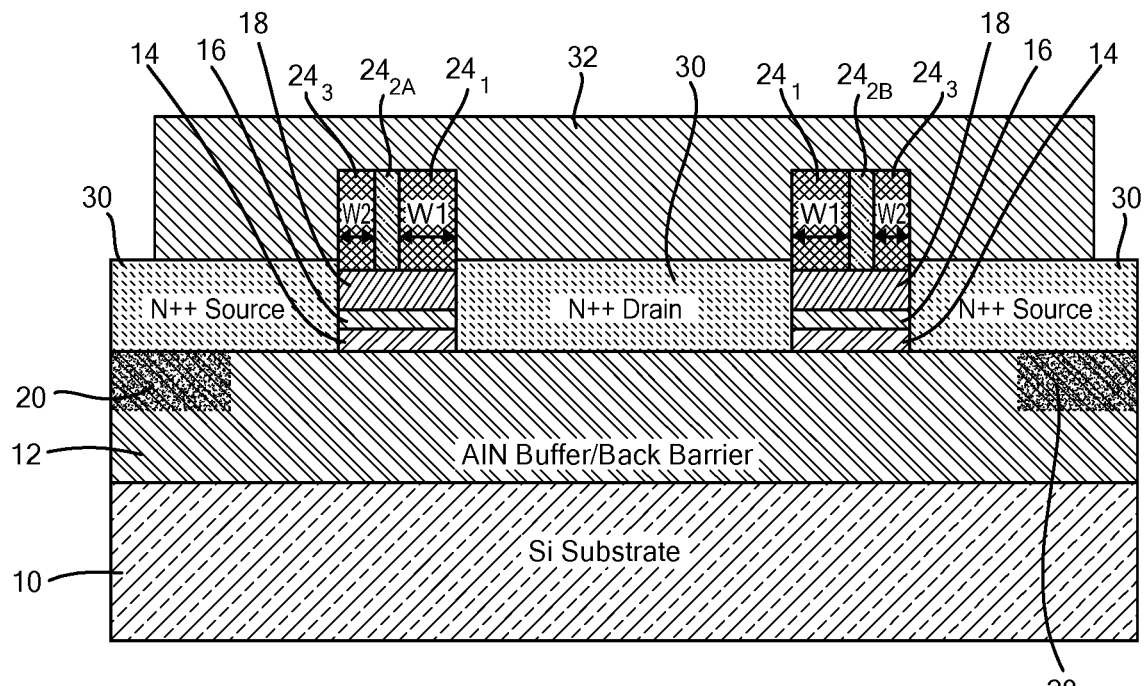
Figure 20P:
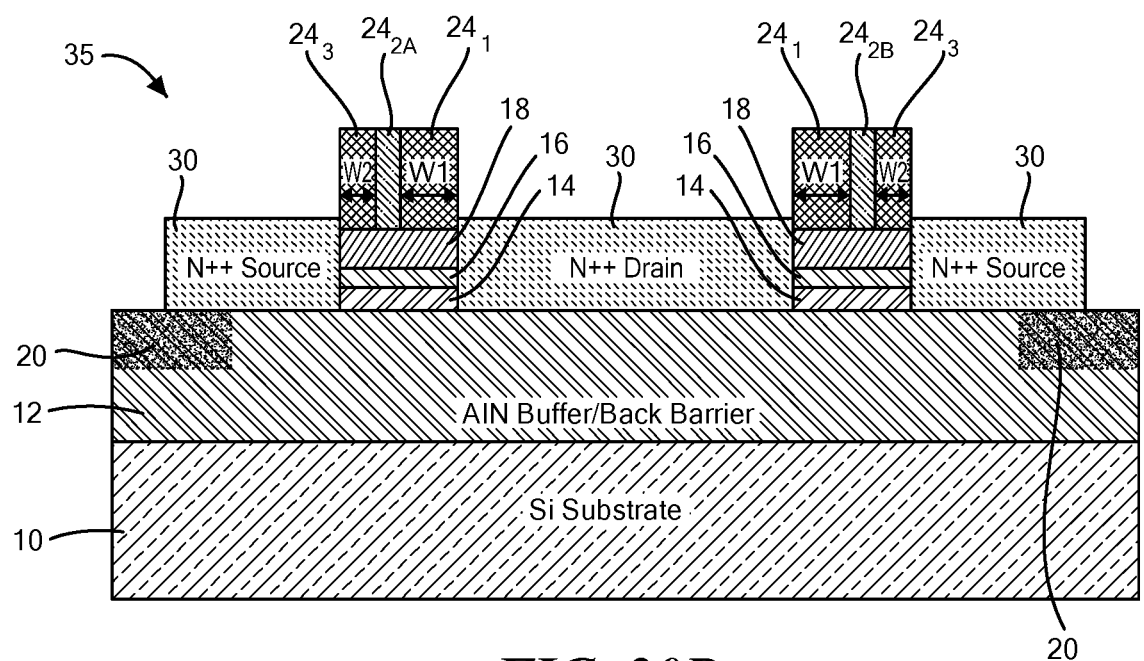
Figure 20Q:
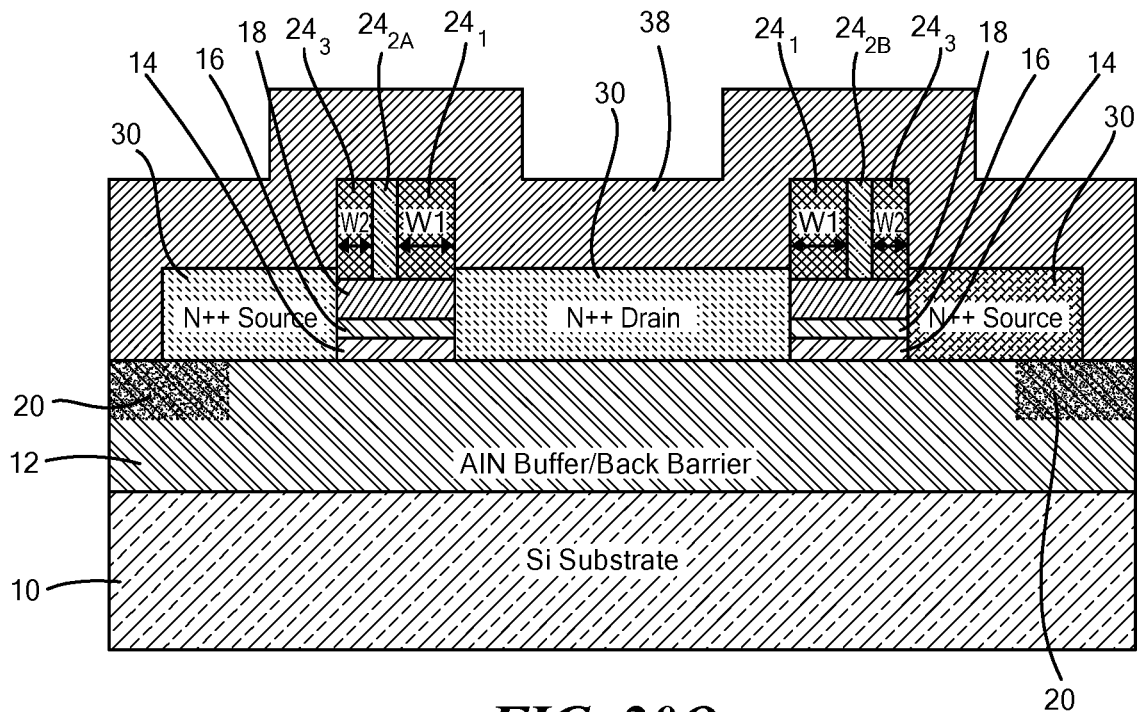
Figure 20R:
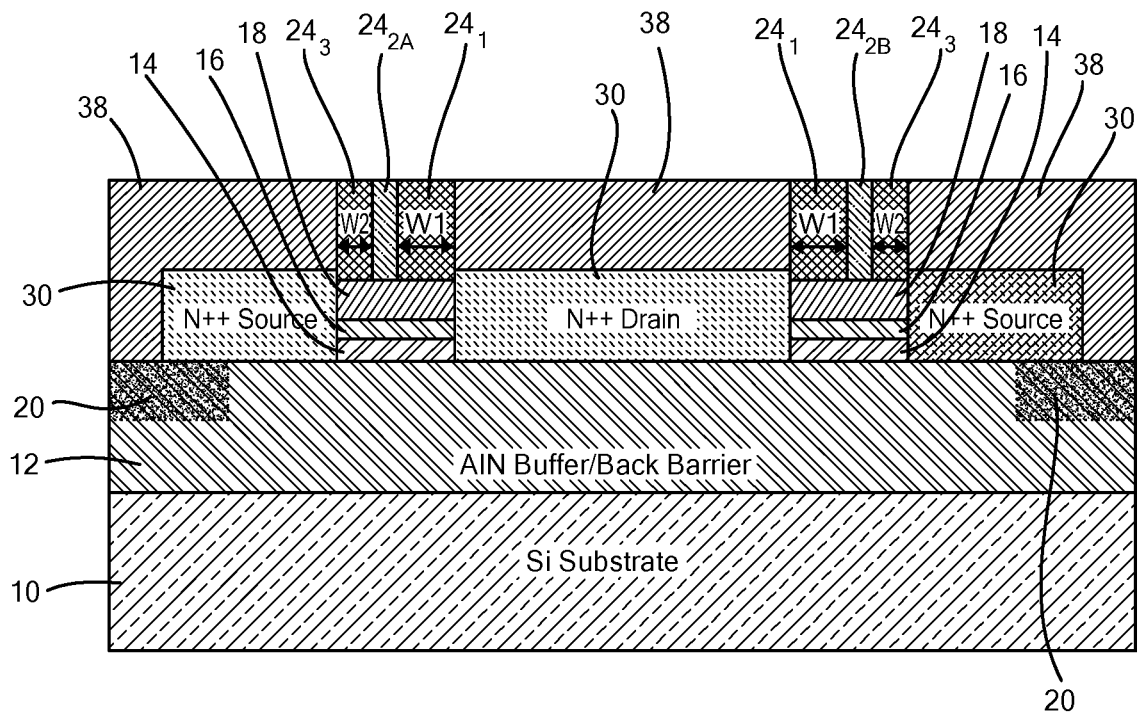
Figure 20S:
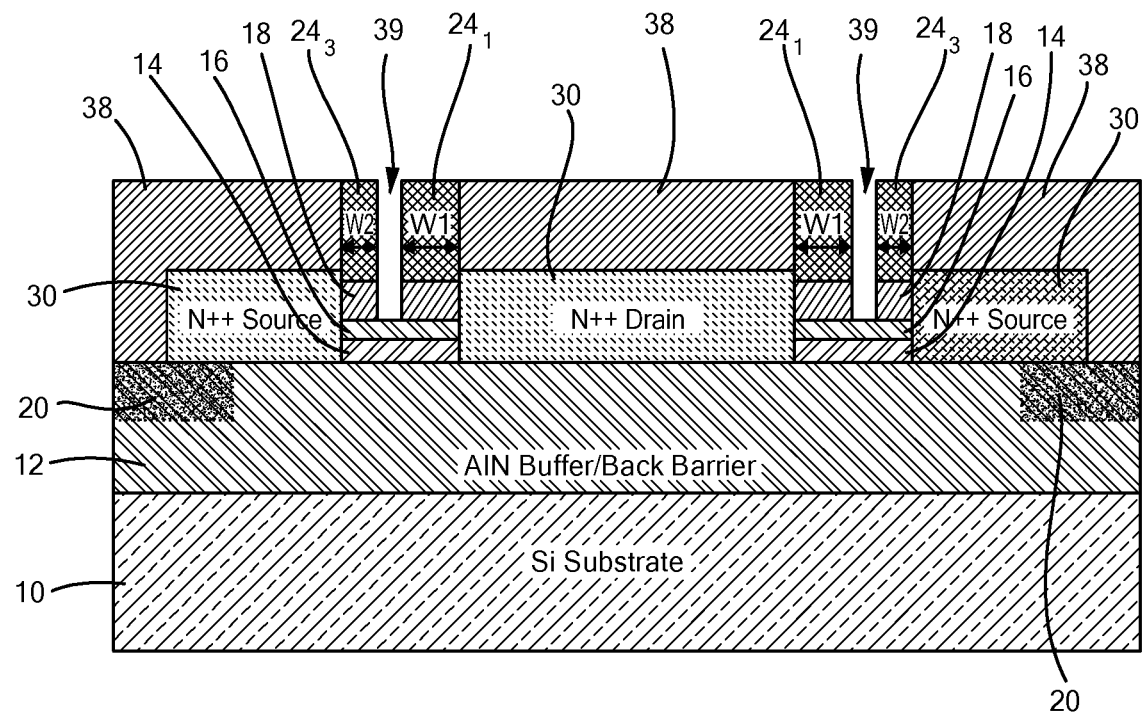
Figure 20T:
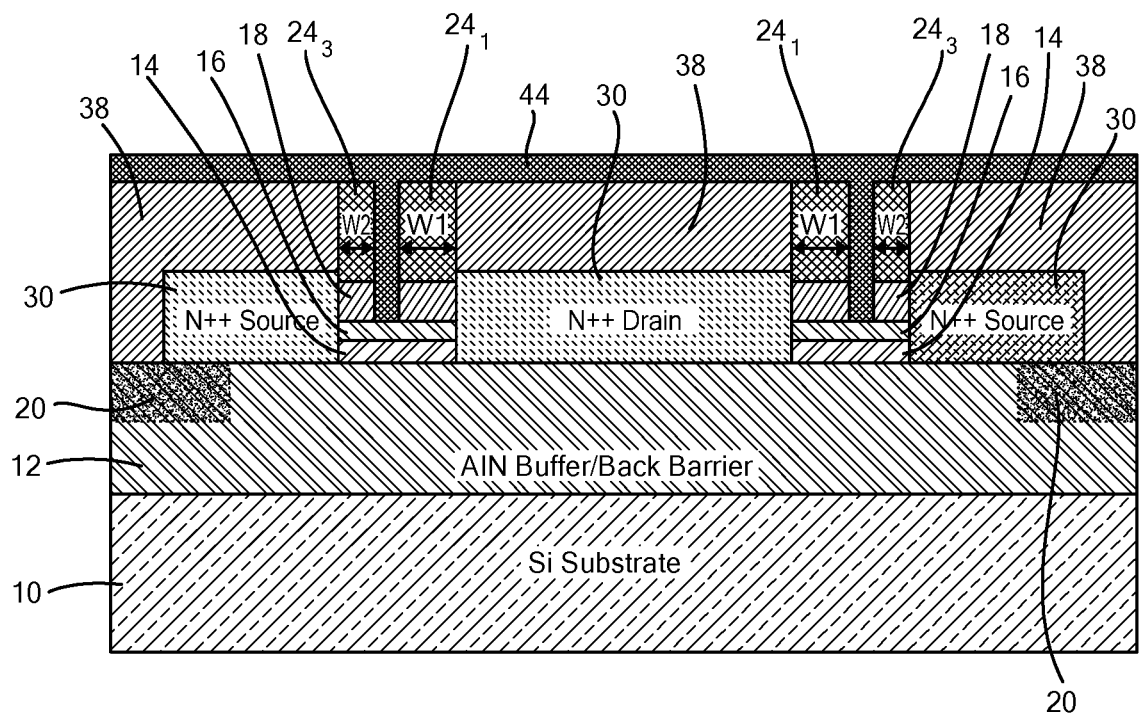
Figure 20U:
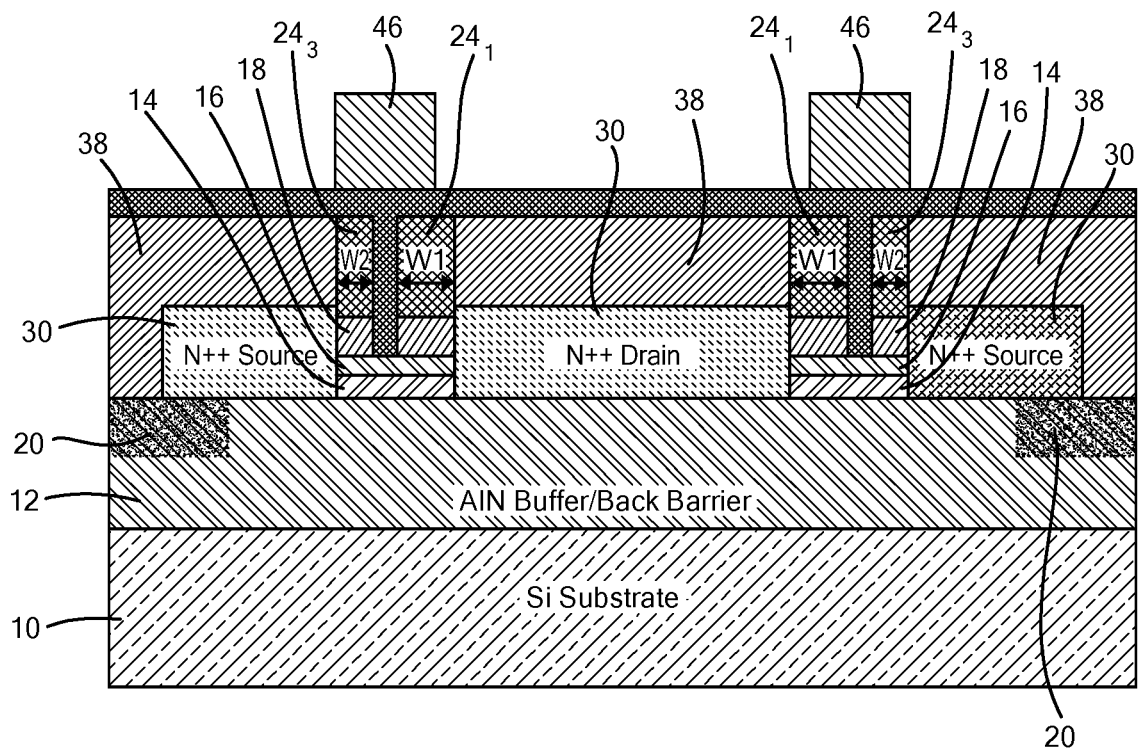
Figure 20V:
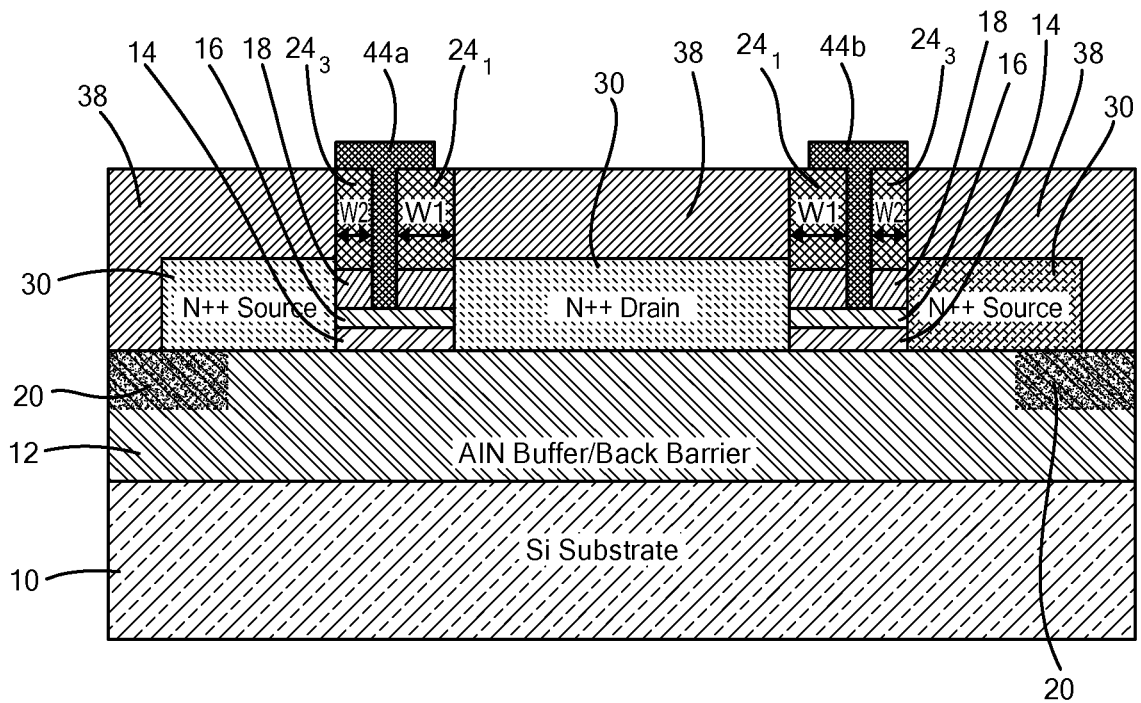

Referring now to FIGS. 20A-20V, an alternative embodiment will be described. Here the separation between the gate electrode and the source electrode will be different from the separation between the gate electrode and the drain electrode; a so-called asymmetrical gate FET gate structure.

Thus, here, after the mandrel 22 is formed as described above in FIG. 4, layer $24_1$ having a uniform thickness of W1 is formed over the surface of the structure shown in FIG. 4, here for example $Al_2O_3$, $SiO_2$, SiN, polycrystalline silicon or an Amorphous Carbon layer deposited by CVD, ALD, sputter to produce the structure shown in FIG. 20A.

Referring to FIG. 20B, the portions of layer $24_1$ are removed as shown using for example directional etch by plasma, ICP or RIE. Mandrel, and spacer material plus etch conditions chosen to provide good dry etch selectivity to produce the structure shown in FIG. 20B. It is noted that portion of layer $24_1$ remain on the vertical sidewalls of the mandrel 22, as shown.

Referring to FIG. 20C, a layer $24_2$ is deposited over the structure as shown, Here, layer $24_2$ is: $Al_2O_3$, $SiO_2$, SiN, polycrystalline silicon, Amorphous Carbon layer or other suitable material is deposited by CVD, ALD, or sputtering.

Referring to FIG. 20D, the portions of layer $24_2$ are removed as shown using for example directional etch by plasma, ICP or RIE to produce the structure shown in FIG. 20D. It is noted that portion of layer $24_2$ remain on the vertical sidewalls of the layer $24_1$ which are, as described above, on the vertical sidewalls of the mandrel 22, as shown.

Referring to FIG. 20E, a layer $24_3$ is deposited uniformly, here having a thickness W2, where W2 is different from W1 over the structure as shown. Here, layer $24_3$ is: $Al_2O_3$, $SiO_2$, SiN, polycrystalline silicon, Amorphous Carbon layer, or other suitable material deposited by CVD, ALD, or sputtering.

Referring to FIGS. 20F and 20G, the portions of layer $24_3$ are removed as shown using for example directional etch by plasma, ICP or RIE to produce the structure shown in FIG. 20F. It is noted that portion of layer $24_3$ remain on the vertical sidewalls of the layer $24_2$, as shown.

Referring to FIG. 20H-FIG. 20J the mandrel 22 is removed as described in connection with FIG. 7A by selective wet or dry etching and then a trim masking lithographic process is used to remove the pairs of opposing layer $24_1$, $24_2$ and $24_3$ while leaving the other pair of opposing layers $24_1$, $24_2$ and $24_3$ as described in connection with FIGS. 7B and 7C to produce the structure shown n FIGS. 20I and 20J.

Referring to FIG. 20K, the exposed portions of the oxide layer 18 are removed as described above in connection with FIG. 8.

Referring to FIG. 20L, exposed portions of layer 16 and 14 are removed as described above in connection with FIG. 9.

Referring to FIG. 20M, a layer 30 of N++ GaN is deposited over the structure as shown by MBE, MOCVD as described above in connection with FIG. 10.

Referring to FIG. 20N, portion on the layer 30 on the upper surface of layers 221, 222, and 223 are removed by selective dry or wet etch, as described in FIG. 12

Referring to FIG. 20O, a photoresist layer 32 is formed over a portion of the structure for the purpose of exposing portion 30A of the N++ regrown Ohmics layer 30; it being noted that the photoresist layer 32 has ends thereof extending over a portion of the implanted regions 30, as described above in FIG. 12A. An etching process is then used to form the mesa structure 35, as described above in FIGS. 14 and 14A, after the mask 34 has been removed, as shown in FIG. 20P.

Referring to FIG. 20Q a dielectric layer 38, here for example, SiNx, is formed over the surface and then chemical mechanical polished, as shown in FIG. 20R exposing upper surfaces of layers $24_1$, $24_2$ and $24_3$, as shown Referring to FIG. 20S, the surface of the structure is masked with windows to exposed portions of the indicated by arrows 39, and then such exposed portions are subjected to a dry, selective etch to remove layer $24_2$, and thereby exposing underling portions of oxide layer 18, such exposed portions of layer 18 then being removed by a plasma etch or ICP or RIE to produce the structure to expose underlying portions of layer 16 as shown in FIG. 20S.

Referring to FIG. 20T gate metal layer structure 44, for example a lower layer of Titanium Nitride (TiN) and upper layer of Tungsten (W) is blanket deposited over the structure, as shown.

Referring to FIG. 20U, a photoresist a mask 46 is used with a dry etch, to pattern layer 44 into a pair of Schottky gate metal contact 44a, 44b, as shown and as described in connection with FIG. 17B and as shown in FIG. 20V.

Figure 20W:
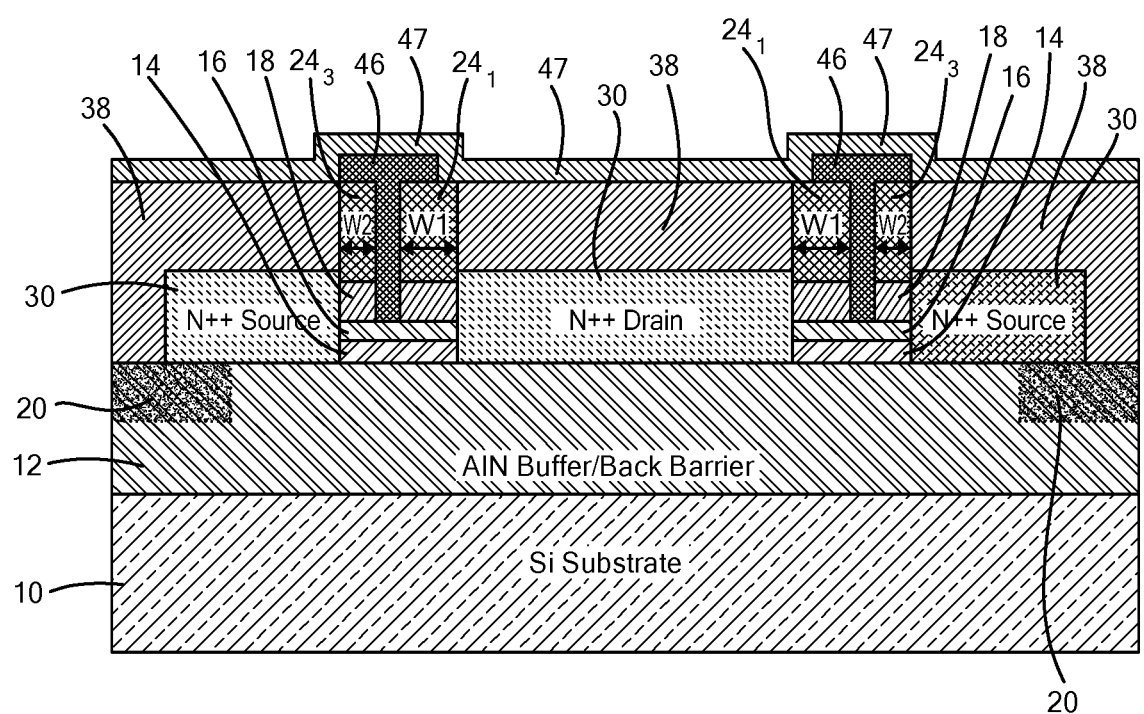
Figure 20X:
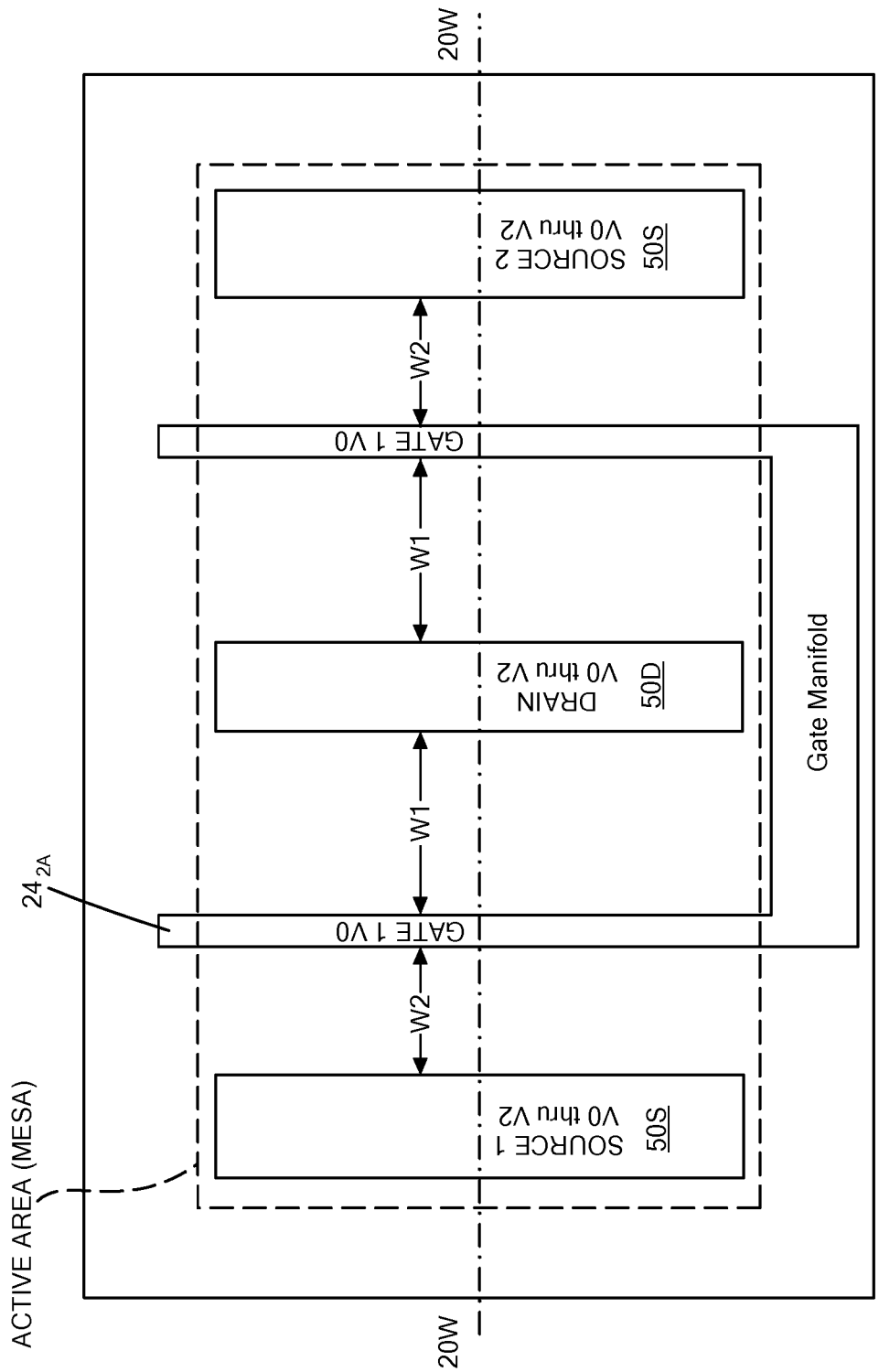

Referring to FIG. 20W a silicon nitride (SiNx) etch stop layer 47 is deposited over SiNx layer 38 and over the pair of Schottky gate metal contact 44a, 44b, as described FIG. 18A. The process then continues as described in the FIGS. 18B through 18I.

Figure 21:
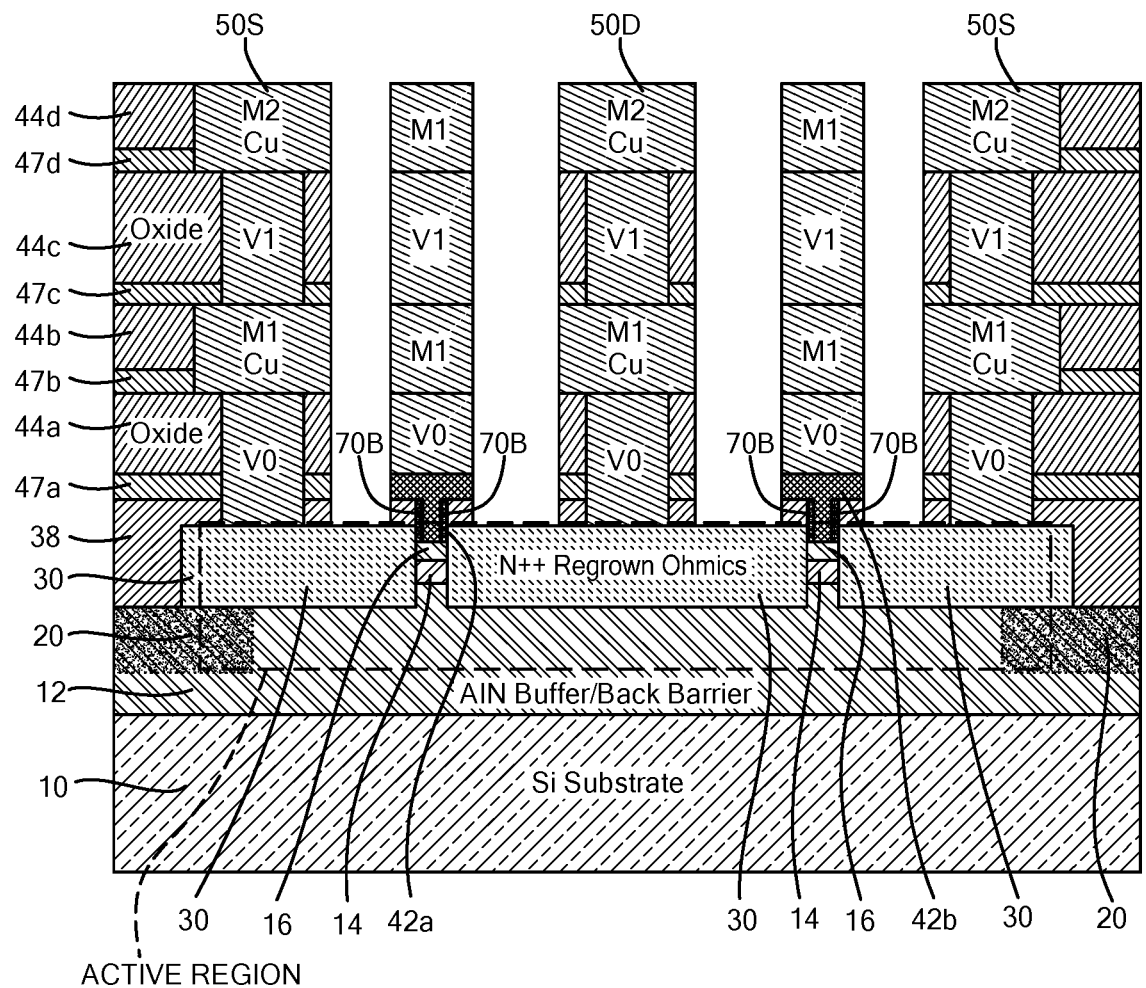
FIG. 21 is a simplified, diagrammatical cross-sectional sketch of the Field Effect Transistor in accordance with an alternative embodiment of the disclosure.

It should be understood that in order to lower gate resistance, and thereby improve frequency response, here for example additional Cu Damascene metal layers M1 and V1 and M2 are stacked above the V0 gate Cu Damascene layer V0 in contact with the gate metal layer 42a, 42b. It should be understood that more or less Cu Damascene layers may be stacked above the V0 Gate. The cross section, as shown in FIG. 21, is formed as previously described above.

A number of embodiments of the disclosure have been described. Nevertheless, it will be understood that various modifications may be made without departing from the spirit and scope of the disclosure. Accordingly, other embodiments are within the scope of the following claims.

What is claimed is:

1. A field effect transistor, comprising:
   a gate contact and gate metal forming a vertical structure, such vertical structure having sides and a top surrounded by an air gap formed between a source electrode and a drain electrode of the field effect transistor;
   a vertical stack comprising:
      a portion of a III-N buffer layer, a portion of a III-N channel layer, and a portion of a III-V buffer layer; and
   a uniformly thick, horizontally extending doped GaN layer disposed on the III-N buffer layer, the uniformly thick, horizontally extending doped GaN layer having an aperture extending vertically there through, the aperture having vertically extending sidewalls terminating at horizontally extending upper surface portions of the III-N buffer layer,
   wherein the vertical stack extends vertically upwardly into the aperture and between the vertically extending sidewalls of the aperture, and
   wherein the vertical structure is disposed on the vertical stack.

2. The field effect transistor recited in claim 1 wherein the source electrode and the drain electrode are damascene structures.

3. The field effect transistor recited in claim 2 wherein the vertical structure having the sides and the top surrounded by the air gap extending vertically to a level parallel to a top of the damascene structures.

4. The field effect transistor recited in claim 3 wherein the gate contact is comprised of a plurality of stacked damascene metal layers.

5. The field effect transistor recited in claim 4 wherein the gate contact is comprised of the plurality of stacked damascene metal layers extending vertically to a level parallel to tops of the damascene structures.

6. The field effect transistor recited in claim 5 wherein the field effect transistor is a mesa structure, wherein the vertical structure having the sides and the top surrounded by the air gap formed between the source and drain electrodes and between edges of the mesa structure are perpendicular to the direction of the gate.

7. A field effect transistor structure, comprising:
   a III-N buffer layer;
   an III-N channel layer of disposed over the III-N buffer layer;
   a III-V barrier layer disposed on the III-N channel layer, wherein a 2DEG is formed in the channel layer;

a uniformly thick, horizontally extending doped GaN layer disposed on the III-N buffer layer, such uniformly thick, horizontally extending doped GaN layer having an aperture extending vertically there through, such aperture having vertically extending sidewalls terminating at horizontally extending upper surface portions of the III-N buffer layer;

a gate electrode;

a vertical stack comprising:
  a portion of the III-N buffer layer;
  a portion of the III-N channel layer; and
  a portion of the III-V buffer barrier layer, wherein the vertical stack extends vertically upwardly into the aperture and between the vertically extending sidewalls of the aperture; and a gate metal disposed on the vertical stack; and source and drain contacts in Ohmic contact with an upper surface portion of the uniformly thick, horizontally extending layer of doped GaN layer, wherein the gate electrode is disposed between the source and drain contacts.

8. The field effect transistor recited in claim 7 including:
a gate contact disposed on the gate metal, and wherein the source and drain contacts have a lower portion; and
wherein the gate contact and the lower portion of the source and drain contacts have upper surfaces disposed in a common plane.

9. The field effect transistor recited in claim 8 wherein the source and drain contacts are damascene structures.

10. The field effect transistor recited in claim 9 wherein the gate contact and gate metal form a vertical structure, such vertical structure having sides and a top surrounded by an air gap extending vertically to a level parallel to tops of the damascene structures.

11. The field effect transistor recited in claim 10 wherein the gate contact is comprised of a plurality of stacked damascene metal layers.

12. The field effect transistor recited in claim 11 wherein the gate contact is comprised of the plurality of stacked damascene metal layers extending vertically to a level parallel to a top of the damascene structures.

13. The field effect transistor recited in claim 8 wherein the gate contact and gate metal form a vertical structure, such vertical structure having sides and a top surrounded by an air gap.

* * * * *